(12) United States Patent
Panella et al.

(10) Patent No.: US 8,376,787 B2
(45) Date of Patent: Feb. 19, 2013

(54) TERMINATION CAP FOR USE IN WIRED NETWORK MANAGEMENT SYSTEM

(75) Inventors: Augusto P. Panella, Naperville, IL (US);
Elliot A. Baines, Naperville, IL (US);
Jeng-De Lin, Yorkville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 13/123,029

(22) PCT Filed: Oct. 7, 2009

(86) PCT No.: PCT/US2009/059798
§ 371 (c)(1),
(2), (4) Date: Apr. 7, 2011

(87) PCT Pub. No.: WO2010/042586
PCT Pub. Date: Apr. 15, 2010

(65) Prior Publication Data
US 2011/0195598 A1 Aug. 11, 2011

Related U.S. Application Data

(60) Provisional application No. 61/103,487, filed on Oct. 7, 2008, provisional application No. 61/103,532, filed on Oct. 7, 2008.

(51) Int. Cl.
*H01R 24/00* (2011.01)
(52) U.S. Cl. .................................. 439/676; 439/620.23
(58) Field of Classification Search .................. 439/676, 439/620.11, 620.17–620.19, 620.23, 488, 439/489
See application file for complete search history.

(56) References Cited

U.S. PATENT DOCUMENTS

| | | | | |
|---|---|---|---|---|
| 5,108,294 A | * | 4/1992 | Marsh et al. | 439/76.1 |
| 5,764,043 A | * | 6/1998 | Czosnowski et al. | 324/66 |
| 6,074,256 A | * | 6/2000 | Arnett | 439/676 |
| 6,079,996 A | * | 6/2000 | Arnett | 439/188 |
| 6,168,472 B1 | * | 1/2001 | Arnett | 439/676 |
| 6,364,694 B1 | * | 4/2002 | Lien | 439/489 |
| 6,590,374 B1 | * | 7/2003 | Har-Lev | 324/66 |
| 6,626,697 B1 | * | 9/2003 | Martin et al. | 439/488 |
| 6,750,643 B2 | * | 6/2004 | Hwang et al. | 324/66 |
| 6,890,197 B2 | * | 5/2005 | Liebenow | 439/188 |
| 6,953,362 B2 | * | 10/2005 | Mossner et al. | 439/395 |
| 7,038,918 B2 | * | 5/2006 | AbuGhazaleh et al. | 361/780 |
| 7,053,598 B2 | * | 5/2006 | Shieh et al. | 324/66 |
| 7,314,392 B2 | * | 1/2008 | Pharn et al. | 439/676 |
| 7,384,300 B1 | * | 6/2008 | Salgado et al. | 439/489 |

(Continued)

FOREIGN PATENT DOCUMENTS

GB 2435969 A 9/2007
WO PCT/EP2008/009395 A2 6/2009

OTHER PUBLICATIONS

International Search Report and Written Opinion for PCT/US2009/0059798, Dec. 2, 2009.

*Primary Examiner* — Ross Gushi
(74) *Attorney, Agent, or Firm* — Timothy M. Morella

(57) ABSTRACT

A termination unit (144) for use with a system that permits the monitoring of a computer network to perform network inventories. The termination unit takes the form of a cap that engages the termination face of a network jack and has a sensing circuit (246) integrated therewith so that, once engaged with the jack, the sensing circuit is connected to two terminals of the jack. The sensing circuit may include a resistor, capacitor or inductor, any of which provide a known sensing value that is different than a sensed value of an end-user device used on the network, but less than infinity so that the system senses when an end-user device is connected to or disconnected from the network.

22 Claims, 17 Drawing Sheets

U.S. PATENT DOCUMENTS

| | | | |
|---|---|---|---|
| 7,722,370 B2 * | 5/2010 | Chin | 439/188 |
| 8,033,873 B2 * | 10/2011 | Ankerstjerne | 439/713 |
| 2002/0019174 A1 * | 2/2002 | Crane et al. | 439/676 |
| 2005/0164558 A1 * | 7/2005 | Ferentz | 439/620 |
| 2008/0113560 A1 * | 5/2008 | Caveney et al. | 439/676 |
| 2011/0195598 A1 * | 8/2011 | Panella et al. | 439/488 |

* cited by examiner

TERMINATION CAP FOR USE IN WIRED NETWORK MANAGEMENT SYSTEM

CROSS-REFERENCES TO RELATED APPLICATIONS

The present invention claims the priority of previously-filed U.S. Provisional Application Nos. 61/103,487 and 61/103,532, both of which were filed on 7 Oct. 2008. The contents of each of these previously-filed Applications are incorporated by reference herein in their entireties.

BACKGROUND OF THE INVENTION

The present invention relates generally to infrastructure management systems and, more particularly, to systems, assemblies and components that are useful in managing infrastructure assets.

Computing networks that exist within large organizations consist of two types of devices that must be inter-connected to form a usable data network. These devices, which are also referred to in the art as assets, are generally classified as end-user devices and networking devices. Examples of end-user devices include personal computers (PC), voice-over-internet protocol (VoIP) phones, and network printers. A typical Local Area Network (LAN) for a large-scale enterprise may include thousands of end-user devices deployed throughout a campus in individual offices or in common areas accessible to the end-users. In addition, data networks also typically include network devices such as switches and routers that form the core of the network. These networking devices serve to route data packets between network devices on the LAN, or between the LAN and the larger corporate Wide Area Network (WAN), or to the internet. These network devices are typically located in a centralized room or rooms, known as wiring closets and data centers.

Information technology (IT) departments for such organizations need to know the status of network connectivity of each end-user device, the physical location of the end-user devices, and need to identify the source and location of any errors or problems as quickly as possible. Tracking of end-user devices is a key concern—for example in monitoring the presence of end-user devices on the network for loss-prevention purposes, or to ensure end-user devices are properly physically positioned in offices or on floors where end users can best utilize them, while maintaining proper connectivity of the network. Currently, a unified system for tracking end-user devices connected to the network and monitoring the status of the physical connectivity of the network does not exist.

The Open System Infrastructure (OSI) model describes layered communications in a computer network. "Layer 1," the physical layer, defines all of the electrical and physical specifications for network and end-user devices connecting to a network. For example, the Institute of Electrical and Electronics Engineers (IEEE) Standard 802.3 defines the standards for wired Ethernet, which is commonly used in computing networks. As part of the IEEE 802.3 Specification, the physical layer of an Ethernet network is defined. Examples of physical layer elements as defined in IEEE 802.3 include electrical voltages and signal protocols, cable requirements, and termination resistance.

To connect the end-user devices to the network devices requires that the network devices in the wiring closet or data center be connected to end-user devices as needed for the particular requirements of the users of the LAN. Each path from switch to end-user device is known as a channel. The typical deployment of physical layer connectivity for a LAN channel consists of a patch cord between a switch port and a patch panel port; a length of multi-pair cable from the rear of the patch panel port to a work area outlet port at the end-user's office, and a patch cord from the outlet to the end-user's device. Each of these ports are modular jacks designed to industry-standard specifications so as to accept mating patch plugs.

The management of the patch cords in the telecom room or at the work area outlet can present issues to the IT management group. Each time an employee is hired, leaves the organization or changes location, it is inevitable that patch cables must be connected and disconnected. A wiring closet typically contains numerous switches, patch panels and patch cords, numbering at times in the hundreds and higher. The patch cords are often snaked around one another, making the operations of adding, removing, or tracing the patch cords difficult and time-consuming. When a new patch cable has to be connected within the system, or a patch cable has to be moved, a technician enters the wiring closet and must locate the appropriate cable among hundreds, or perhaps thousands, of patch cords. The technician then must locate the appropriate patch panel and the appropriate ports on those patch panels. Finally, the technician must connect the patch cord to the correct ports on the patch panels and verify that the connection has been done correctly. Once the patch cord is connected, there is not an easy, cost and time-effective way to determine if the cord was connected to the correct port(s). For example, the technician may have to go to the network port or end-user device located at a remote location, such as an individual's office, to determine if the patch cable was correctly inserted and that network connectivity is available at the asset. Therefore, connecting and transferring networks assets is labor-intensive.

Additionally, the IT department does not have an efficient way to determine the exact location of network problems which may be attributed to the physical layer. For example, the problem may be located in the switch closet if a patch cord was not properly connected, or the problem may exist in the wiring from the switch closet to the end-user device. The IT department does not currently have an efficient way to determine if network problems exist in the physical network wiring. Accordingly, a need exists for a better information management system that includes components that simplify the process for identifying end-user devices in order, at a minimum, to reduce the time required to move and check end-user devices on a network.

An additional area of concern is that the LAN may have substantial numbers of unused or spare permanent links. A spare permanent link refers to a cable connection from patch panel to a work area outlet, but without a network device and/or end-user device connected via patch cords. Such links are typically maintained in LAN deployments to ensure appropriate capacity in case of employee moves, adds or changes, or to ensure extra capacity for disaster-recovery scenarios. An issue facing IT managers today is that it is difficult and time consuming to re-test spare permanent links to verify connectivity prior to their being put into use. Consequently most spare permanent links are not tested on a regular basis, and if there is a problem with the connectivity of the link, the issue may not be discovered until the permanent link is activated as part of a working channel. This can cause delay and added expense as the problem is tracked down and repaired.

U.S. Pat. No. 6,590,374, issued Jul. 8, 2003 to Har-Lev describes a terminator unit for use in wiring networks for naming outlets and for verifying the normality of the wiring.

The terminator includes a connector with a plurality of contacts and a set of resistors. The resistors of the first set are connected between a common point and a selected contact, such that a particular binary code is determined according to the particular combination of resistors connected to the contacts.

Periodic probing or polling of all ports on the network is performed in order to list, or catalog, all of the connected end-user devices order to develop an inventory of the same. Assembling this inventory requires "pinging" every connection port on the network and gathering data from the connected end-user devices. This network intensive process is typically performed not more than once per month in order to limit disruption to the network. Accordingly, a system that is capable of providing up-to-date information whenever an end-user device is connected to the network without more frequent system-wide polling is desirable.

SUMMARY OF THE INVENTION

Accordingly, it is a general object of the present invention to provide an improved system for monitoring a network having multiple work area outlets to which are connected various end-user devices, the system facilitating the inventorying of the network and monitoring the end-user devices.

Another object is to provide a termination unit for use in a system that monitors a wired computing network having a plurality of end-user devices, the termination unit including a cap portion that is configured to matingly engage a termination face of a work area outlet that is connected to the computing network, the cap portion including at least one electronic element supported thereby having a specific measured value by which a change in the impedance of the system can be measured and forming a parallel system circuit with the network cable, and the cap portion further including at least a pair of terminals that contact opposing terminals of the work area outlet so as to complete the parallel circuit when the cap portion is mated with the network jack.

Yet another object is to provide a termination cap for use in a wired computing network having a plurality of work area outlets, wherein the termination cap includes an insulative housing, a substrate supporting a resistive element disposed in a resistance circuit thereon and at least two terminals extending therefrom for mating with corresponding opposing mating terminals of a termination face of the work area outlet, the termination unit including a plurality of engagement members projecting therefrom in opposition to slots formed on the termination face of the work area outlet, the terminals of the termination cap being aligned with the engagement members so as to be shielded thereby and the terminals being aligned with two selected terminals of the work area outlet so as to connect the resistance circuit to the work area outlet in parallel.

A still further object is to provide a termination cap for use with a data or computer network having a system for monitoring the presence of end-user devices connected to the network, the termination cap including a sensing element, or circuit, that connects with selected terminals of two distinct differential signal wire pairs of a work area outlet, the sensing element having a preselected sensing value that affects the impedance of the system, such that when the termination cap is connected to the work area outlet, there is a first sensing value in the network cable leading to the work area outlet, which is different than infinity and is different than the sensing value of the end-user device, and which may be read remotely at the work area outlet by a scanner to thereby determine whether or not an end-user device is connected to the work area outlet, thereby providing the monitoring system with a means for determining when an end-user device has been attached to the network at a specific location on the network.

Yet another object is to provide a method for monitoring the work area outlets of a data communication network for connectivity by providing a series of work area outlets interconnected as a network, and connecting network cables to the work area outlets and providing a termination unit for each work area outlet that terminates two of the wires of the each network cable, with a resistance circuit of a given value, arranged in parallel with the work area outlet, and then monitoring the work area outlet for a change in impedance which results when a device is connected to or removed from the work area outlet.

These objects and advantages are accomplished by way of the structure of the termination cap. The jacks used in the systems of the inventions utilize insulation displacement terminals that are disposed along a rear, or terminating face of the jack. A termination unit, or cap is provided that mates with the rear insulation displacement terminals of the jacks used in the work area outlet. The termination cap preferably includes a resistive element supported on a substrate which defines resistance circuit. Two conductive terminals are supported by the termination unit and are located in the termination unit so as to intersect or make contact with two of the insulation displacement terminals on the jack terminating face. The terminals are arranged so that they will contact terminals terminated to two distinct differential signal wires pairs, and not contact any terminals which are terminated to a differential signal wire pair. As such, the connection is made between pairs and not within pairs. In this manner, the termination unit of the present invention utilizes the existing wiring of a network and does not require a ninth wire or a proximity switch within the work area outlet as do some monitoring systems.

The terminals of the termination unit have a depth sufficient to make contact with the terminals, but not large enough to cause the insulation displacement terminals to spread apart and possibly destroy the integrity of the connection with the wires of the network cable. The terminals lead to circuitry on a substrate supported by the termination unit which includes a electronic element, having a preselected measured value that when connected to the network, will change the impedance of the cable and/or work area outlet. The electronic element will typically be chosen from the group consisting of resistors, capacitors, inductors and combinations of the same. Typically, the electronic element is chosen as a resistive element. The value of this resistive element is chosen such that it is greater than the impedance of an Ethernet end-user device, which is about 150 ohms, and it is less than the resistance of an open circuit, namely infinity. The terminals make contact with the wires of two distinct differential signal pairs so that a parallel path resistance circuit is provided, so that when the work area outlet has no end-user device connected to it, the system will read the resistance of the termination unit, and when an end-user device is connected to the work area outlet, the system will read the resistance of the end-user device.

Although in the preferred embodiment, resistive elements are used and the sensing value used is the resistance value of the system, other electronic elements that affect the impedance of the system, such as capacitors, inductors, a combination of the two or all three may be used to provide similar results. All such elements will affect the impedance of the system, including the network cables and will complete parallel circuit paths when the termination cap is terminated, thereby changing the value of the sensing element to a distinct, measurable value for indicating another condition of the network. When incorporated into a termination cap, the termination cap becomes connected to various connection points of the network, the connectivity and status of which may now be measured. These connection points are chosen by the network designer where there is interest in confirming the presence of a network cable or patch cord.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which.

DETAILED DESCRIPTION OF THE PREFERRED EMBODIMENTS

The following description is intended to convey the operation of exemplary embodiments of the invention to those skilled in the art. It will be appreciated that this description is intended to aid the reader, not to limit the invention. As such, references to a feature or aspect of the invention are intended to describe a feature or aspect of an embodiment of the invention, not to imply that every embodiment of the invention must have the described.

Figure 1:
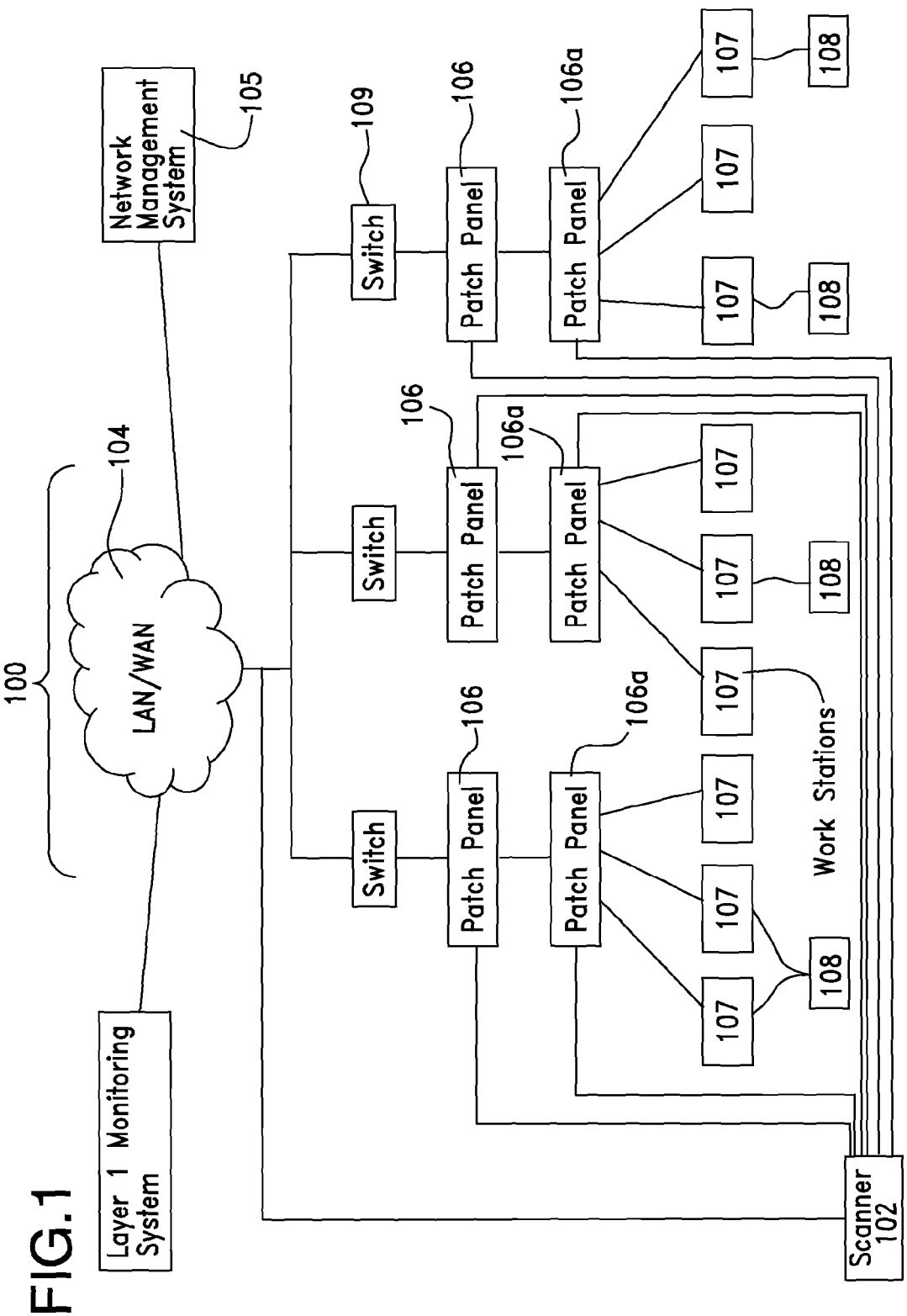
FIG. 1 is a system diagram that illustrates a computing network including patch panels, scanners and a server in which the termination units of the invention are utilized.

Turning to the drawings and referring first to FIG. 1, a typical computing, or data transmission, network 100 is illustrated to show the environment in which the patch panel assemblies of the present invention are used. An example of such a data network is a corporate electronic computing network with multiple users and network and end-user devices connected thereto by which network users can access, exchange and store data. As used herein, the term "end-user device" refers to a physical item that is connected to a work area outlet and which can be operated by any user of the network and may include, without limitations, a personal computer, telephone, printer, facsimile machine, monitor or other devices, while the term "network device" refers to a physical device that is accessed but not necessarily operated by a user of the network and may include, a scanner, server, switch, patch panel and the like. The network preferably includes a scanner 102, which is used to monitor the network devices that are connected to the network 104 and which are connected via a series of patch panels 106.

The scanners 102 monitor the network devices which are connected to the network. In one embodiment, the scanner 102 communicates with the patch panels 106 using a serial data connection. Each patch panel 106 is further connected to multiple network devices or the work area outlets 107 by way of a switch 109. By connecting ports between the patch panels 106 with a patch cord, various network devices can communicate with each other. Switches 109 can probe all of the work area outlets on the network in order to catalog end-user devices connected thereto and in doing so, perform an inventory of all such devices connected to the network. A server 105 is connected to the switch 109 which is connected to the patch panels 106 and it may instruct the switches 109 to probe the connection ports of the patch panels 106.

The patch panel 106 may be mounted in a rack with other such panels within a dedicated wiring room, such as a wiring closet. These panels 106 have a plurality of individual ports into which cables may be mated to connect the parts on various panels together. The rear of each port has a cable terminated to it, which leads to a work area outlet 107 to which an end-user device 108 may be connected. The cable may be of an Ethernet standard, containing eight conductive wires that are arranged as twisted pairs, i.e. four pairs of differential signal wires. The switches 109, patch panels 106, work area outlets 107 and end-user devices (collectively, 108) cooperate to form the portion of the network 104 which the scanner 102 monitors.

Figure 2:
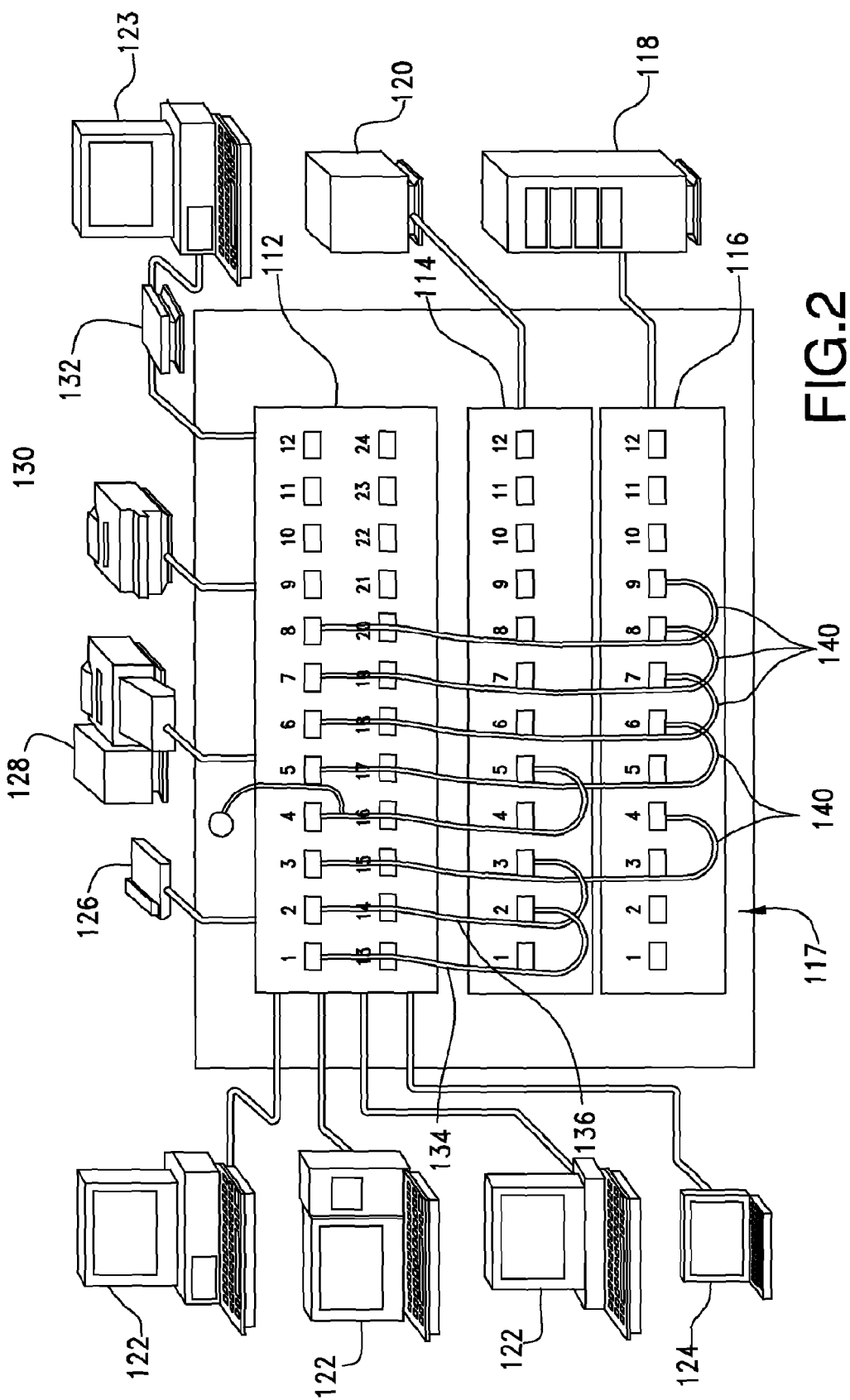
FIG. 2 is a diagrammatic view of a computing network that incorporates the systems of the present invention, illustrating the placement of network and end-user devices and interconnecting patch cords.

FIG. 2 is a diagram of one embodiment of a computing network including a patch panel, patch cords, network devices and end-user devices. Three patch panels 112, 114 and 116 are shown arranged in a rack and are connected to network devices such as an ancillary server, or driver, 118 that is connected to the main server 105 of the network. The second patch panel 114 connects to another network device in the form of a public telephone system exchange ("PBX") 120, while a third patch panel 112 connects to the work area outlets and the various end-user devices, such as personal computers ("PCs") 122, a laptop computer 124 connected to a work area outlet located in a meeting room or similar environment, a VoIP ("Voice Over Internet Protocol") phone 126, a fax machine 128 and a printer 130. One PC 123 connects to the third patch panel 112 through a modem 132. In this exemplary embodiment, all of these devices cooperatively communicate using the IEEE 802.3 standard, commonly referred to as the Ethernet standard.

The VoIP phone 126 must connect to the PBX 120 in order to make and receive calls. Therefore, in this example, the VoIP phone 126 is wired to port 1 on the patch panel 112. A patch cord 134 connects port 1 on the third patch panel 112 to port 2 on the second patch panel 114. In this example, all ports on the second patch panel 114 are wired to the PBX 120. Therefore, the VoIP phone 126 connects through the patch cord 134 to the PBX 120. Likewise, the fax machine 128 and modem 132 connect to the PBX 120 through similar patch cords. The fax machine is wired to port 5 on the patch panel 112 and connects to the PBX 120 through patch cord 136. Similarly, the modem 132 connects to the PBX through the patch cord 138. The PCs 122, laptop 124 and printer 130 are each wired to the patch panel 112. Other patch cords 140 connect the respective ports for each device of the third patch panel 112 to the first patch panel 116. Thus each of the PCs 122, laptop 124 and printer 130 can communicate with the server 118. In one embodiment, a switch (not shown) allows each of the end-user and network devices to communicate with each other.

In one embodiment, the system has the ability to perform the monitoring of all the devices connected to the network. For example, the master server 105 may monitor the issuance of addresses, such as dynamic host configuration protocol ("DHCP") and internet protocol (IP) addresses. In some network environments, network devices obtain an IP address from a DHCP server when they connect to the network. In such an environment, the server 105 can monitor the issuance of IP addresses and poll newly connected devices using, for example, the simple network management protocol ("SNMP"). SNMP is used to monitor network attached devices.

U.S. Pat. No. 6,590,374, issued to Har-Lev describes one implementation for a terminator unit for use in networks for naming work area outlets and for verifying the normality of the wiring. The terminator unit of the '374 patent requires a pair of resistors be provided for each wire of a network work area outlet, and these resistor pairs are arranged so as to define a unique identifier code to the work area outlet for system monitoring purposes. As such, the structure of such a terminator unit is complex and requires extensive labor to compile the assignment of identifier codes by arranging the resistors in order to develop a binary code number to be used as the identifier. As such, the use of such a structure is complicated and requires a large amount of labor to install. The present invention provides an advantage over the terminator unit of the '374 patent, which is less expensive and does not require excessive labor for its implementation.

Figure 3A:
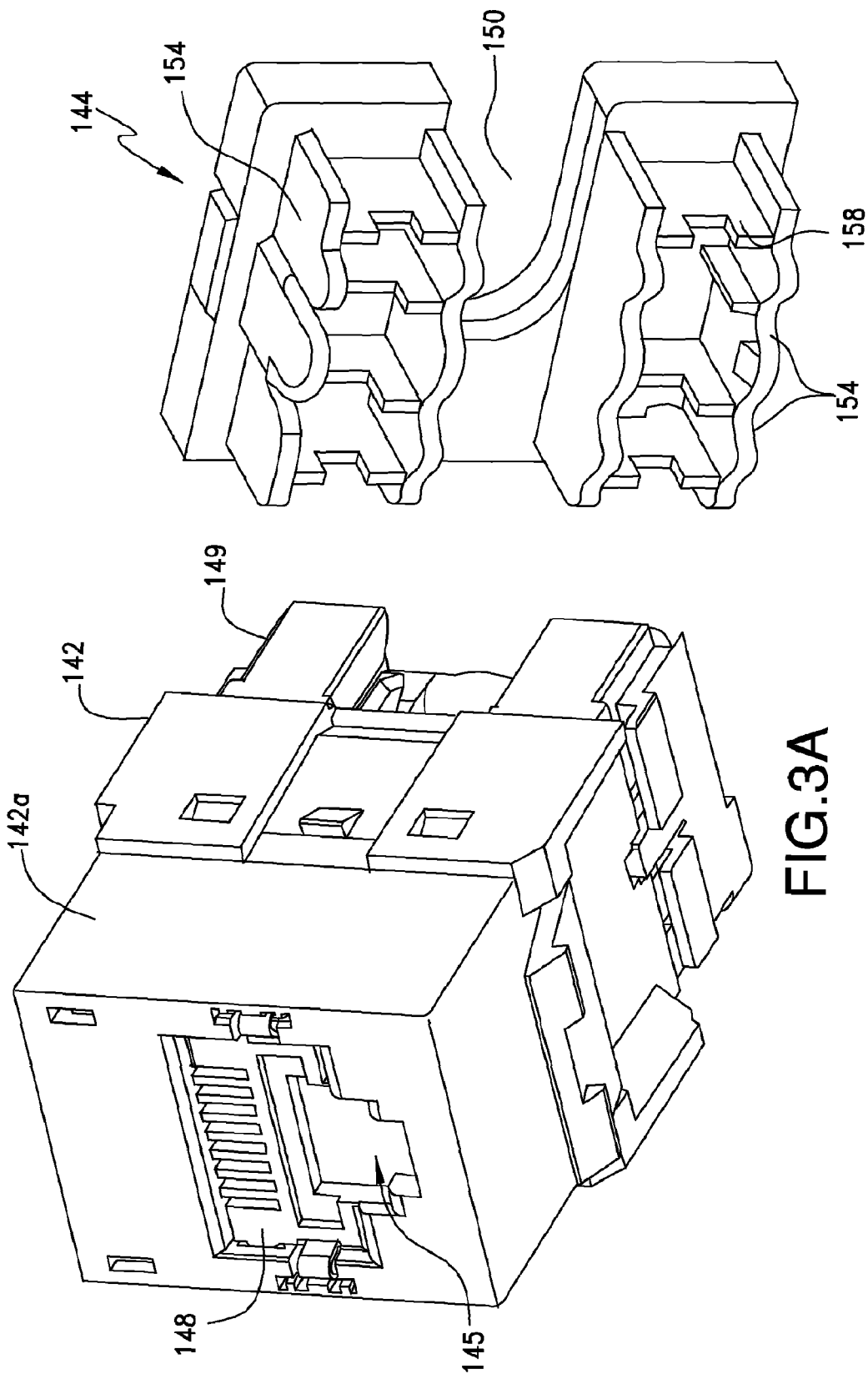
FIG. 3A is a perspective exploded view of one embodiment of a network jack used in a work area outlet of the system of FIG. 1 and a termination cap that can be mated to the jack.
Figure 3B:
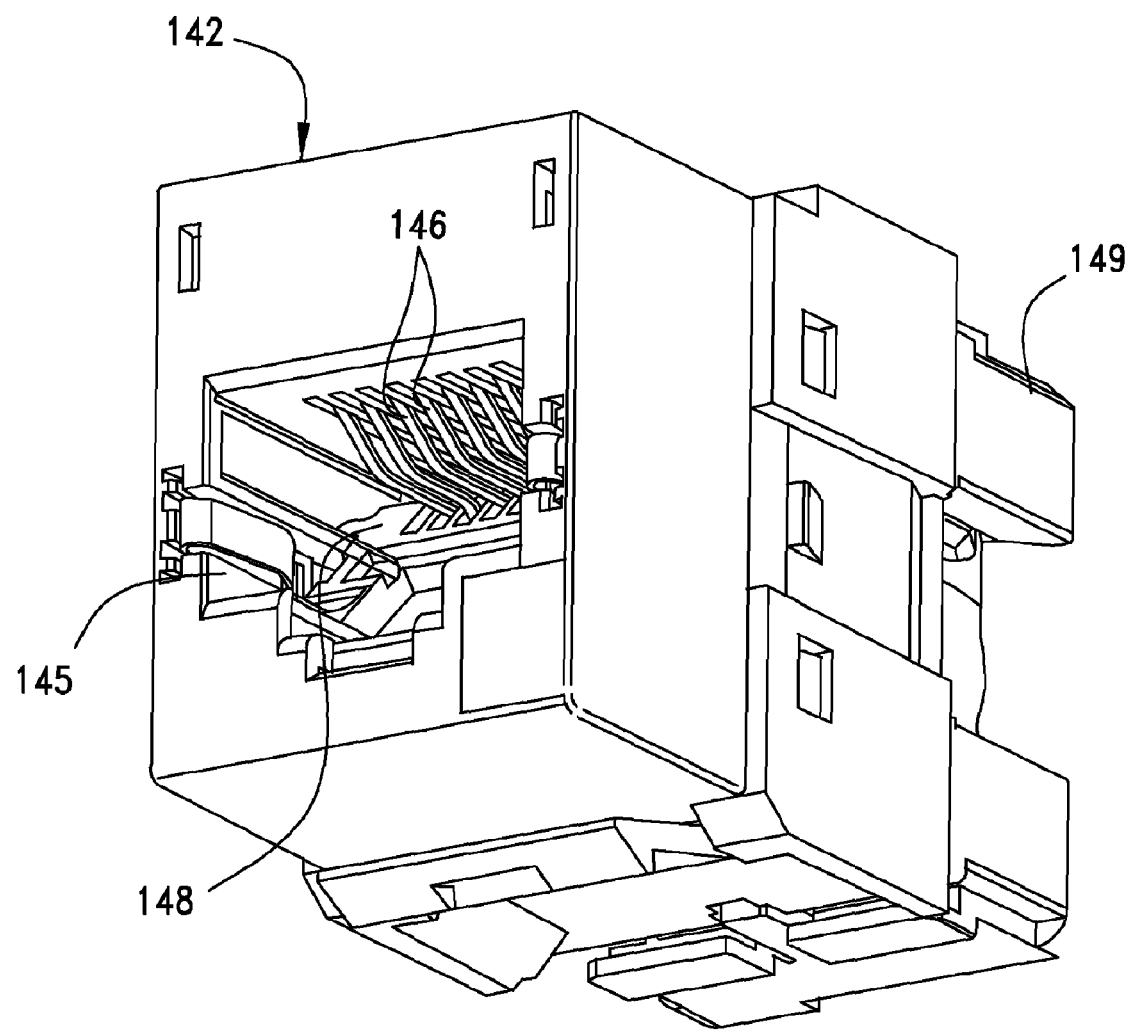
FIG. 3B is the same as FIG. 3A, but without the termination cap and illustrating the shutter of the jack in an open position, exposing the interior terminals of the jack.
Figure 3C:
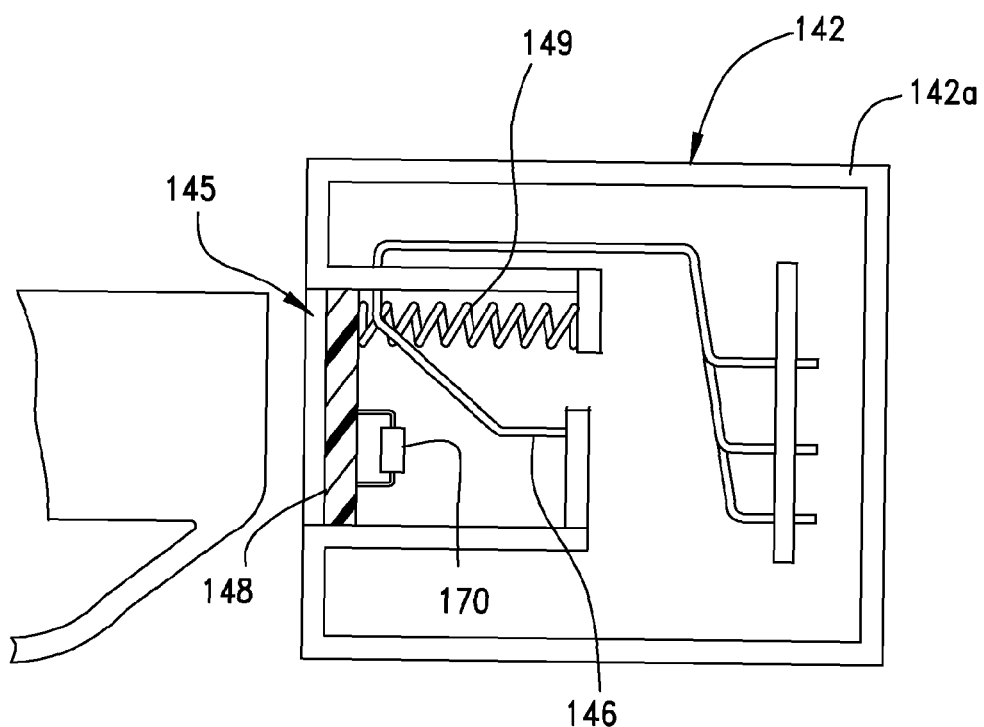
FIG. 3C is a diagrammatic view of a network jack with a shutter-actuated sensing circuit, wherein the jack shutter is closed, and the sensing circuit disconnected from the work area outlet.
Figure 3D:
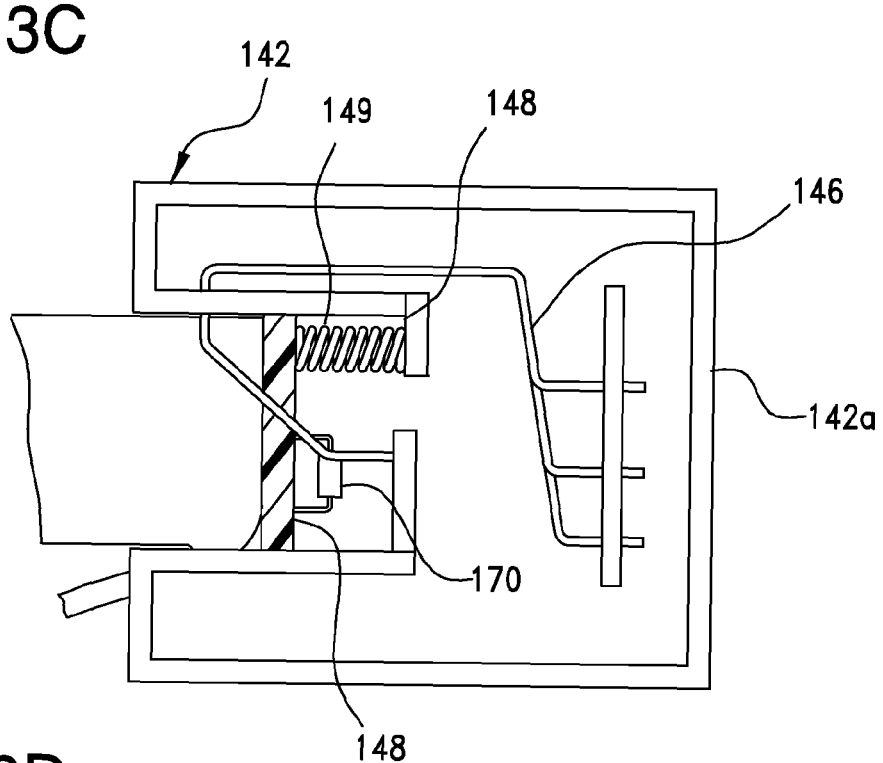
FIG. 3D is the same view as FIG. 3C, but with the jack shutter in an open position and the sensing circuit connected to the work area outlet.
Figure 4:
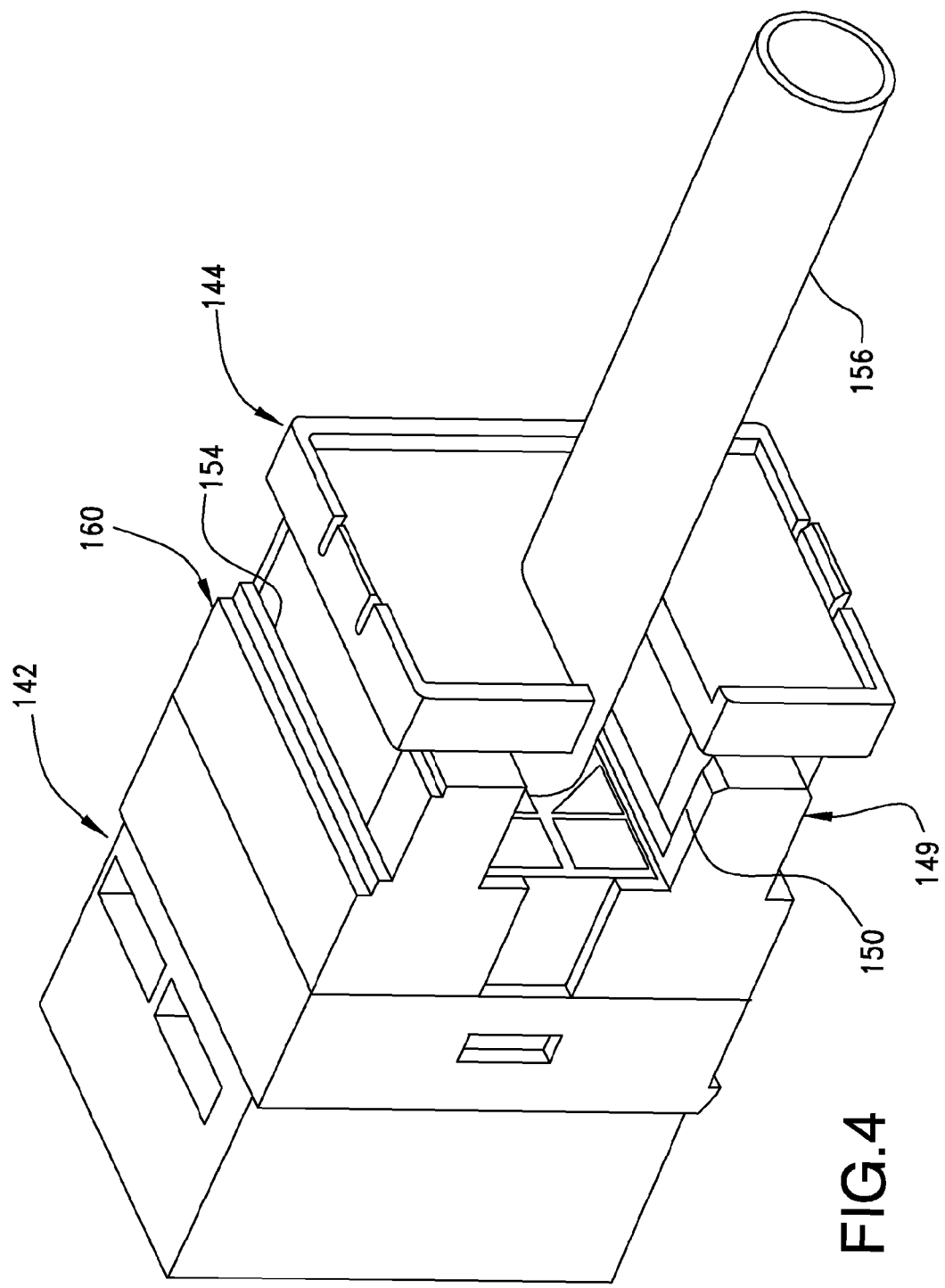
FIG. 4 is the same view as FIG. 3, but taken from the rear with a network communication cable in place therewith.
Figure 5:
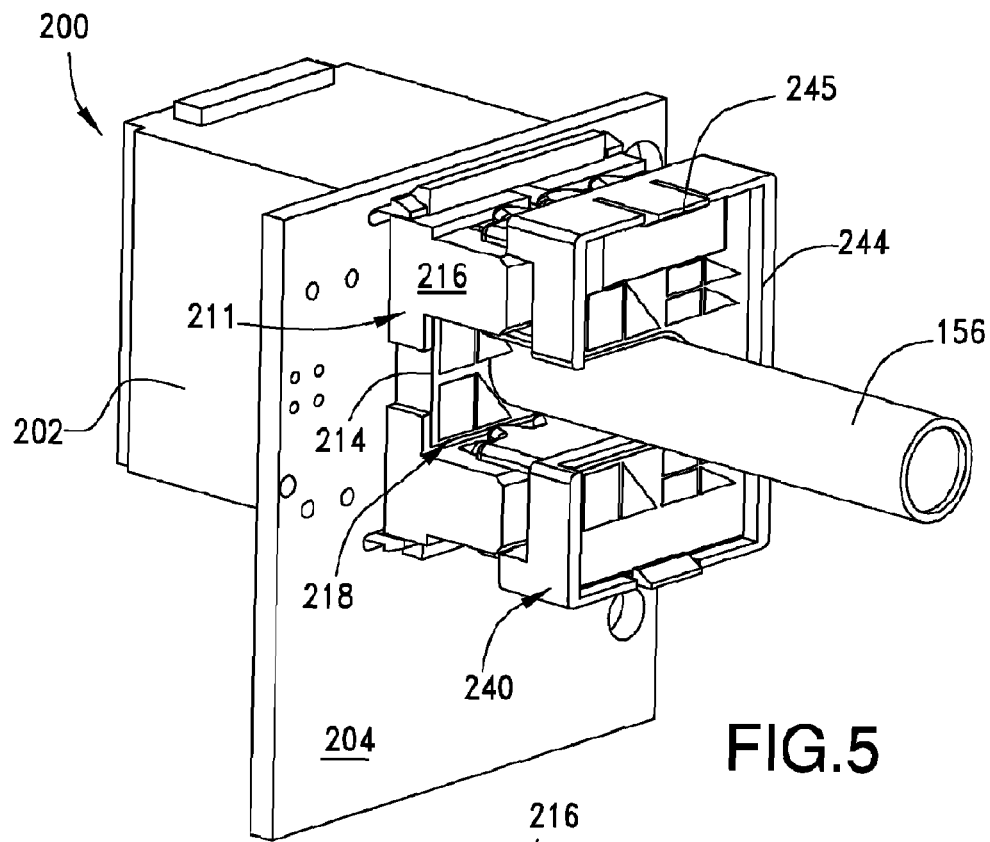
FIG. 5 is a view similar to FIG. 4, but illustrating a jack and termination member mounted to a circuit board.
Figure 6:
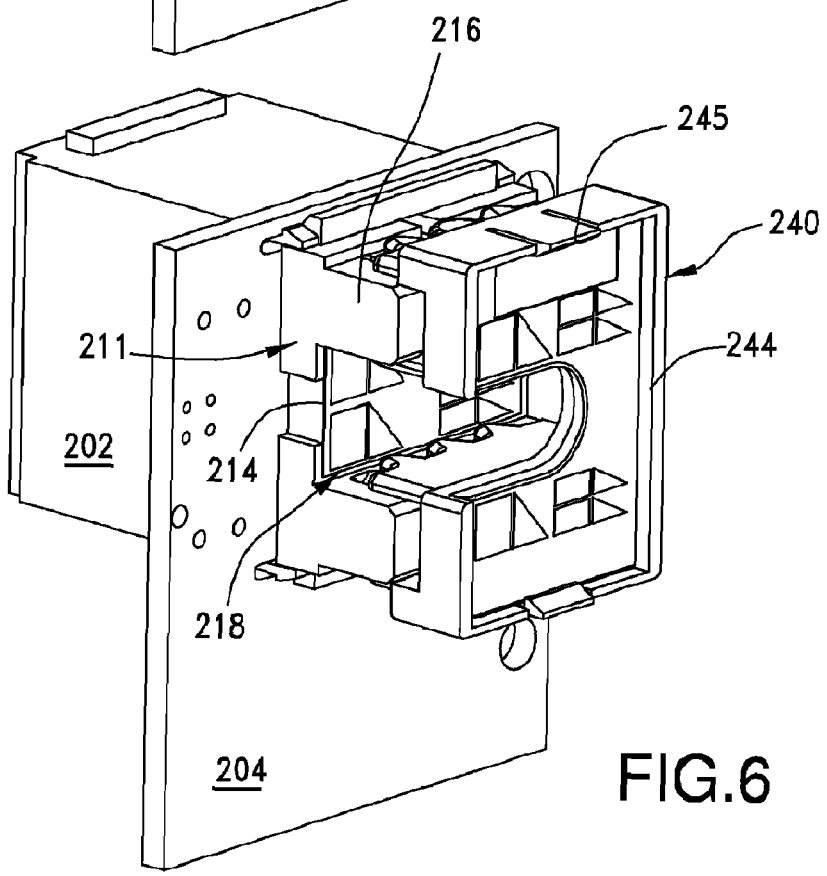
FIG. 6 is the same view as FIG. 5, but with the network cable removed for clarity.
Figure 7:
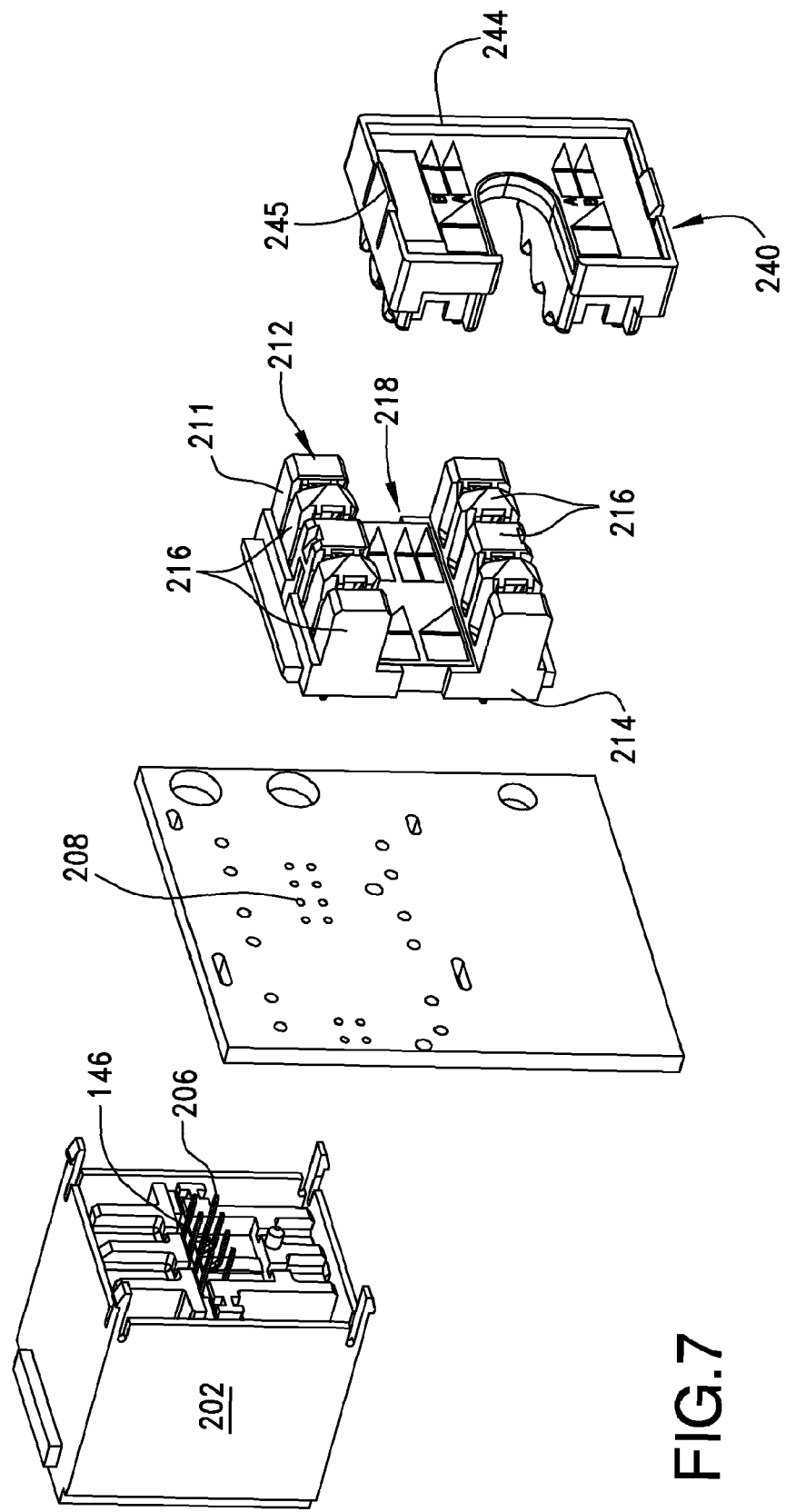
FIG. 7 is an exploded perspective view of the structure of FIG. 7.
Figure 8:
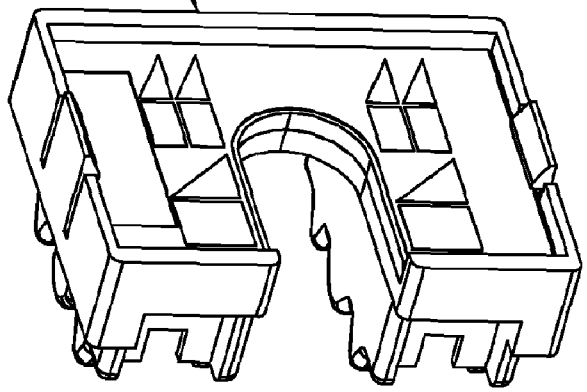
FIG. 8 is the same view as FIG. 6, but with the termination unit removed and spaced apart from the termination face of the jack for clarity.
Figure 8:
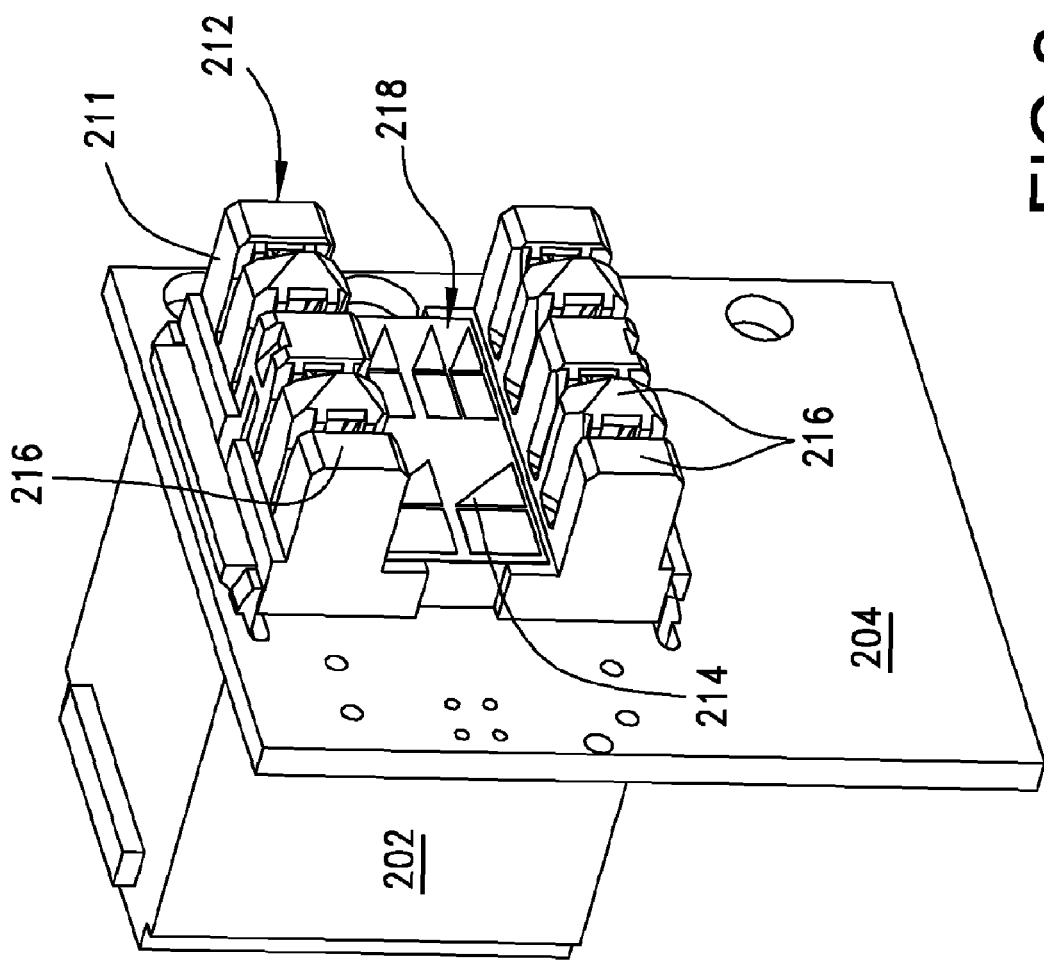
Figure 9:
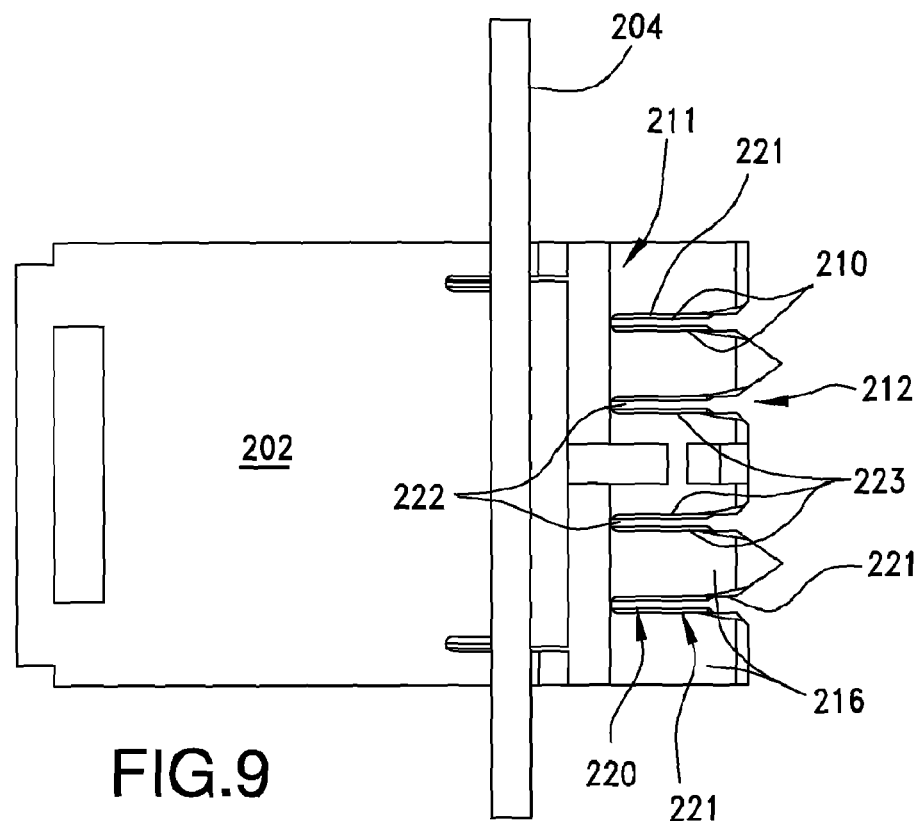
FIG. 9 is a side elevational view of FIG. 8 illustrating only the jack and its termination face and showing the insulation displacement terminals of the termination face of FIG. 8.
Figure 10:
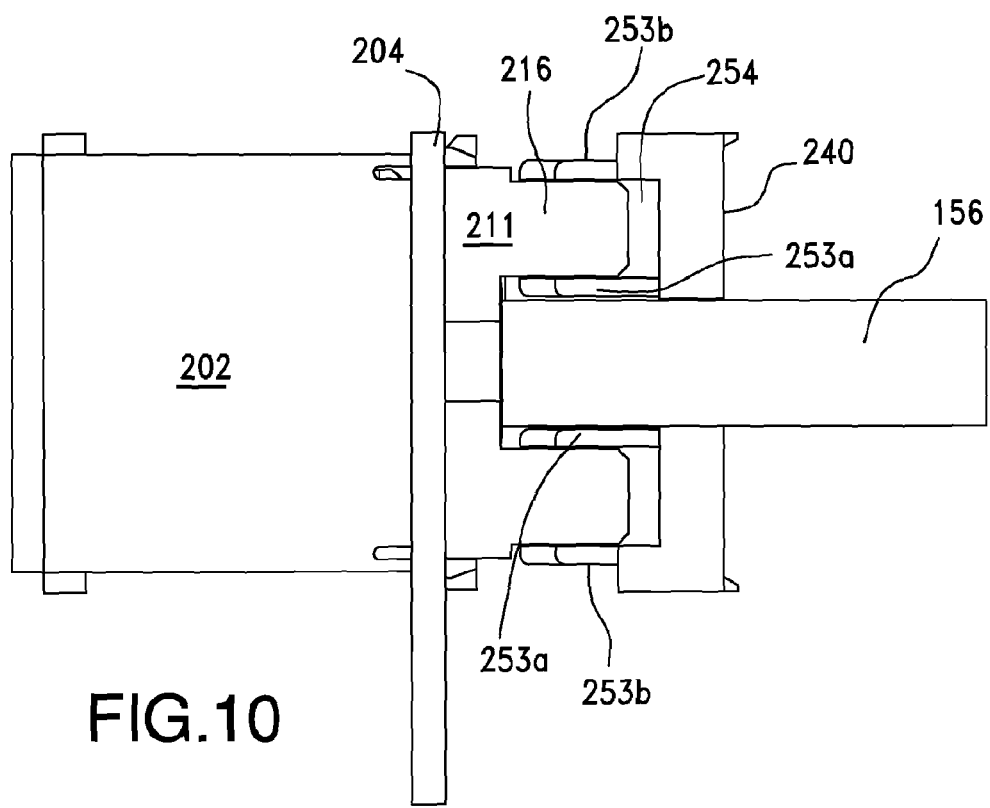
FIG. 10 is the same view as FIG. 9, but with the termination unit engaged with the jack termination face and the network cable terminated thereto.
Figure 11:
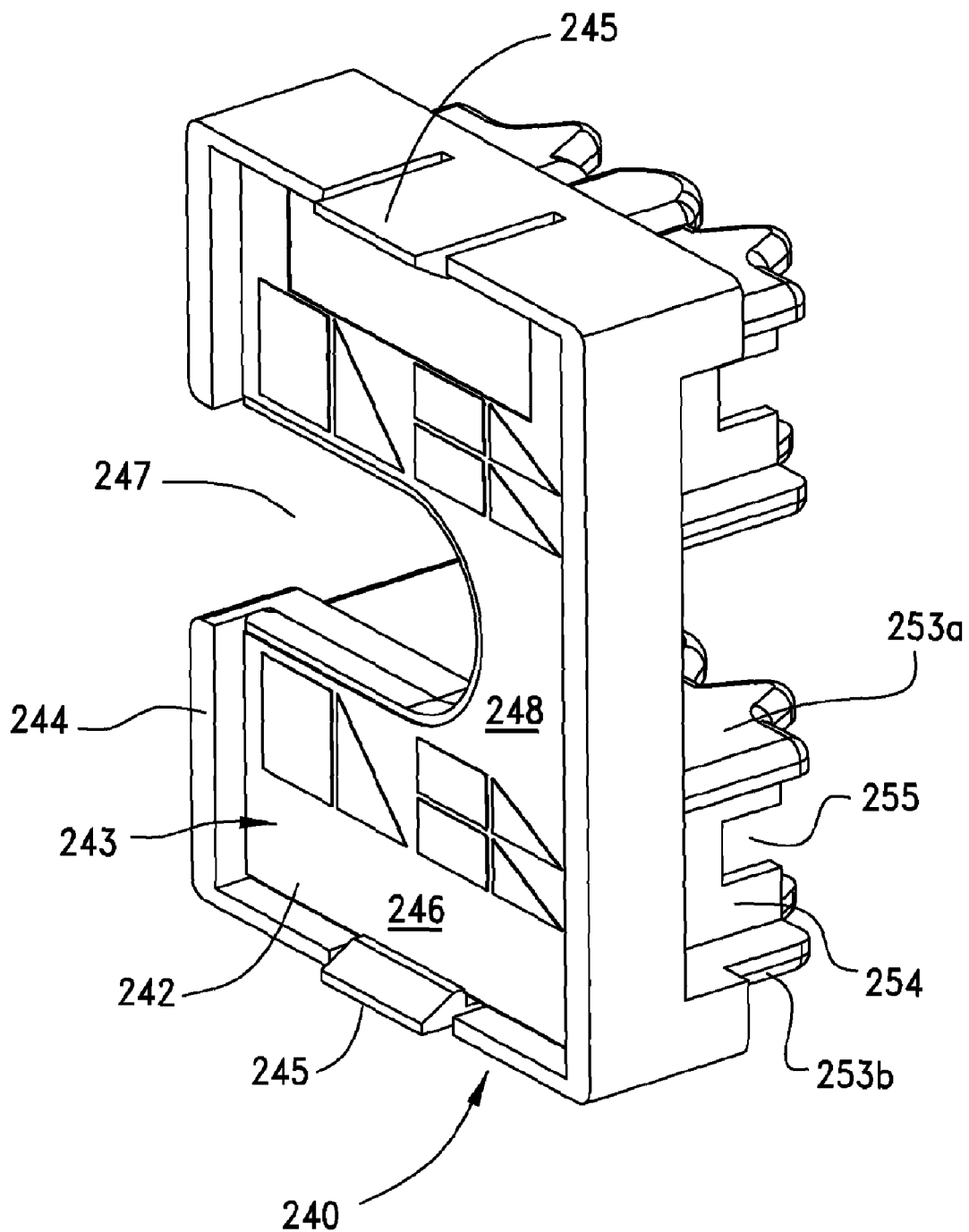
FIG. 11 is a perspective view of the termination unit of FIG. 6.

In the systems of the invention, an improved termination system such as that illustrated in FIGS. 3-4 is used to enable the system to monitor the network at the work area outlet level and determine connectivity of the network cable to the work area outlet and other components of the network, as well as the connectivity of network devices to the work area outlets.

FIGS. 3-4 illustrate an RJ-45-style jack 142 including a termination unit 144, which is used for connecting various network components together, including network devices to work area outlets. The jack 142 is used to provide a work area outlet at a specific location where a device may be installed by a connection thereto on an intended permanent basis or a transitory basis, such as in a meeting room, office or cubicle.

The jack 142 has a housing 142a that is typically located within a wall plate in an office or room, and multiple work area outlets using multiple jacks may be located in a single room or office. The jack includes an internal socket 145 for accepting a device cable and the RJ-45 jack can accept any plug that is intermateable with an Ethernet outlet, meaning it has eight terminals arranged to provide four differential signal pairs. Other multi-paired wire jacks, such as RJ-11 jacks may be used. Individual terminals 146 in the jack mate with corresponding terminals in the network cable (not shown). The jack 142 may also include a shutter 148 that closes the opening of the jack. In FIGS. 3A-3B, the shutter 148 may be biased by a spring 149 and rotatably mounted within the jack 142 such that inserting a plug into the jack 142 rotates, or pivots, the shutter 148 downwardly toward the rear of the bottom of the jack opening 145. When the plug is removed from the jack 142, the shutter 148 springs into place at the front of the jack opening 145. In this manner, the shutter 148 prevents dirt from entering the jack 142 and provides a means of determining whether the plug is fully inserted in to the jack 142. If the plug is not fully inserted, the spring-loaded shutter 148 will eject the plug. As noted below, the shutter may be utilized to provide a parallel sensing circuit.

The termination unit 144, as shown in the Drawings, takes the form of a cap that is generally U-shaped and includes a center slot 150 through which the network cable passes. The termination cap 144 preferably holds the cable to reduce stress on the connection between the cable and the network jack 142. The network cable 156 connects to the jack 142 using insulation displacement technology ("IDT") terminals 152 that are supported on a rear, terminating face 149 of the jack. The IDT terminals 152 pierce the insulation of the individual wires within the network cable in order to make an electrical connection between the jack terminals 142 and the network cable wires. Ribs 154 are disposed on the termination unit 144 that provide a means for the termination unit 144 to mate and engage the jack 142. These ribs 154 are interconnected by cross pieces 158 that are received, at least partly, within slots 162 that are formed in the jack receptacle termination face 160 and which also house the IDC terminals. The termination unit 144 has a general U- or C-shaped configuration with a center slot 150 disposed therein.

FIG. 4 illustrates a rear perspective of the work area outlet jack 142 including a network work area outlet cable 156 terminated to the jack and with a termination cap 144 in place, attached to the jack 142. An electronic element is disposed within the termination cap 144 and it is preferably provided with leads so as to define a sensing circuit that makes contact with two of the wires in the network cable by way of the IDT terminals of the jack. This sensing circuit is disposed so that when the termination cap 144 is mated to the jack termination face, the sensing element becomes connected and a parallel circuit path is formed with wires of the network cable 156. In terms of a specific sensing element, such as a resistor, the sensing resistor is connected by way of the termination cap 144 and now a parallel resistance, which is different than the resistance of open, unconnected outlet or a network device connected to the outlet can be read. The electronic sensing element may be a resistor, a capacitor, an inductor or pairs of any two or a combination of all three elements. All three elements will affect the system impedance at that location, as measured through the cable 156 and the sensing element in the termination cap 144.

In the embodiment of FIGS. 3A-3D, a resistor 170 is shown used as an electronic element with a measureable value to connect two terminals of the jack 142 together. The resistor 170 (FIGS. 3C-3D) may be mounted within the jack as opposed to the termination cap 144, and specifically on the shutter 148 in a location such that when the shutter is in the closed position, the resistors make no contact with the terminals 146 in the jack 142 and the resistance measured by the system is that of an open (i.e., one to which no end-user device is connected) work area outlet, which provides a resistance value of infinity which indicates that no device is connected to the work area outlet. When an end-user device is connected to the work area outlet, the plug thereof is inserted into the jack 142, as shown in FIG. 3D, the shutter 148 moves to the open position, and as the shutter slides back into the jack 142, the resistor 170 is moved into contact with selected terminals 146 of the jack 142, creating a new resistance value that can be sensed. This is shown diagrammatically in FIGS. 3C-3D, where the shutter 148 has a sliding movement as opposed to the rotating movement shown in FIGS. 3A-3B. As shown, the shutter moves between first and second operative positions where when the shutter is closed, the sensing circuit is not connected in parallel to the work area outlet and its associated network cable.

Alternate embodiments are contemplated, one of which is where one or more sensing elements, preferably resistors are mounted on the shutter 148 in a fashion such that when the shutter 148 is closed, the resistor(s) is connected to the work area outlet terminals and/or the network cable wires. When a connecting cable is inserted into the jack opening 145, the shutter is displaced into an open position and the resistor(s) is moved out of contact with the terminals/wires, reducing the sensed resistance load on the work area outlet 107. Different values may be measured by the system in this manner to indicate the status of the work area outlet 107.

Therefore, in the particular embodiment of FIGS. 3A-3D, a different resistive load is placed on the sensing circuit within the network cable when an end-user device is inserted into the jack 142. Electronics to perform the sensing may be integrated into the patch panels 106, scanner 102, server 105 or into another dedicated or multifunction network device connected to the network 104.

Another embodiment of a termination unit connected in accordance with the principles of the present invention is illustrated in FIGS. 5-16, wherein a work area outlet 200 is shown as including a jack-style housing 202 that is mounted to a circuit board 204. The housing 202 is insulative and has a jack opening with a structure that is typical of Ethernet jacks. The inner terminals 146 of the jack opening include a plurality of tail portions 206, typically eight in number to match the eight wires used in the arrangement of four pairs of differential signal wires commonly used in Ethernet data transfer. The tail portions 206 extend through holes, or vias 208 disposed in the circuit board 204.

The tail portions 206 are connected to terminals 210 supported by a termination element 211 that has a termination face 212 disposed thereon. This termination face 212 is seen to include a flat base portion 214 and a plurality of posts 216 projecting out from the base portion 214. The posts are arranged in two rows of five posts each and are spaced apart from each other to define an intervening space 218 therebetween. The posts 216 are themselves spaced apart from each other within each row and separated by intervening slots 220 that extend generally perpendicular to the intervening space 218. Each slot 220 contains an IDT in the form of a conductive plate-like terminal 221 that has a center slot 222 defined therein between two opposing tine portions 223. The slot 222 is sized so that the tine portions 223 bite into and pierce the outer insulation of the wires to make electrical contact between the wire and the terminal 221. The network cable 156 may extend at least partially through the intervening space 218 and its individual wires spread out to engage the IDC of the termination face and the network cable may be extend straight out from the rear of the jack through the center slot 247 of the termination unit 240.

Figure 12:
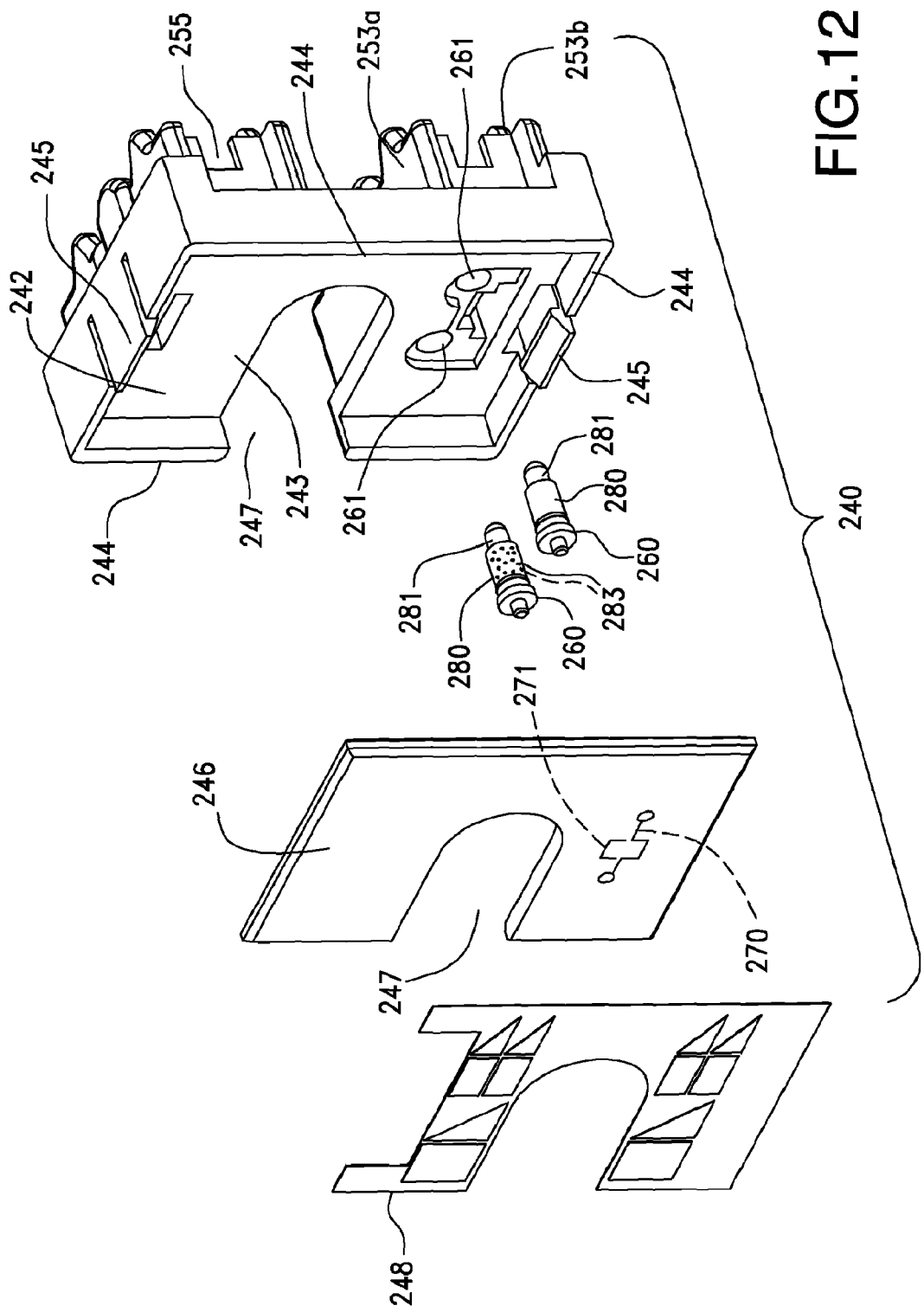
FIG. 12 is an exploded view of FIG. 11.
Figure 13:
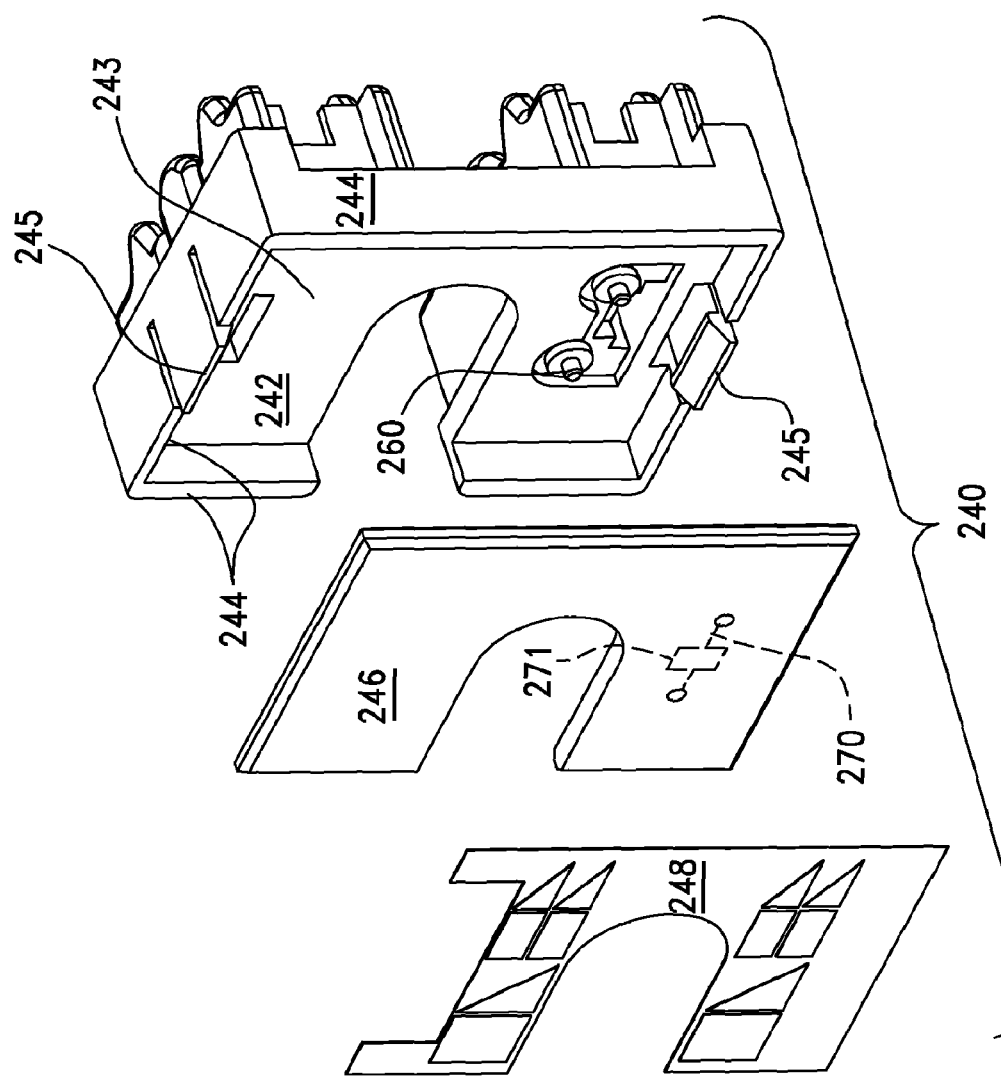
FIG. 13 is the same view as FIG. 12, but with the terminals held in place with in the termination unit body portion.

In this regard, the termination unit 240 is provided in the form of a cap 241 that engages the termination face 212 of the jack termination element 211. More specifically, the cap 241 is formed from an insulative material that has a preferably flat base portion 242 that has a well, or recess 243 disposed therein and defined by a plurality of sidewalls 244. A pair of clips 245 may be found along two opposing edges of the base portion 242 as part of the sidewalls thereof. The recess 243 receives a circuit substrate 246 which, as illustrated in FIG. 12, is preferably planer and the substrate 246 and the base portion 242 include a central slot 247. Visual indicia, in the form of a label, or decal 248 may be provided on the exposed surface of the substrate 246 in order to assist the installer. As with the first embodiment of the invention, this embodiment also includes a center slot 247.

Figure 14:
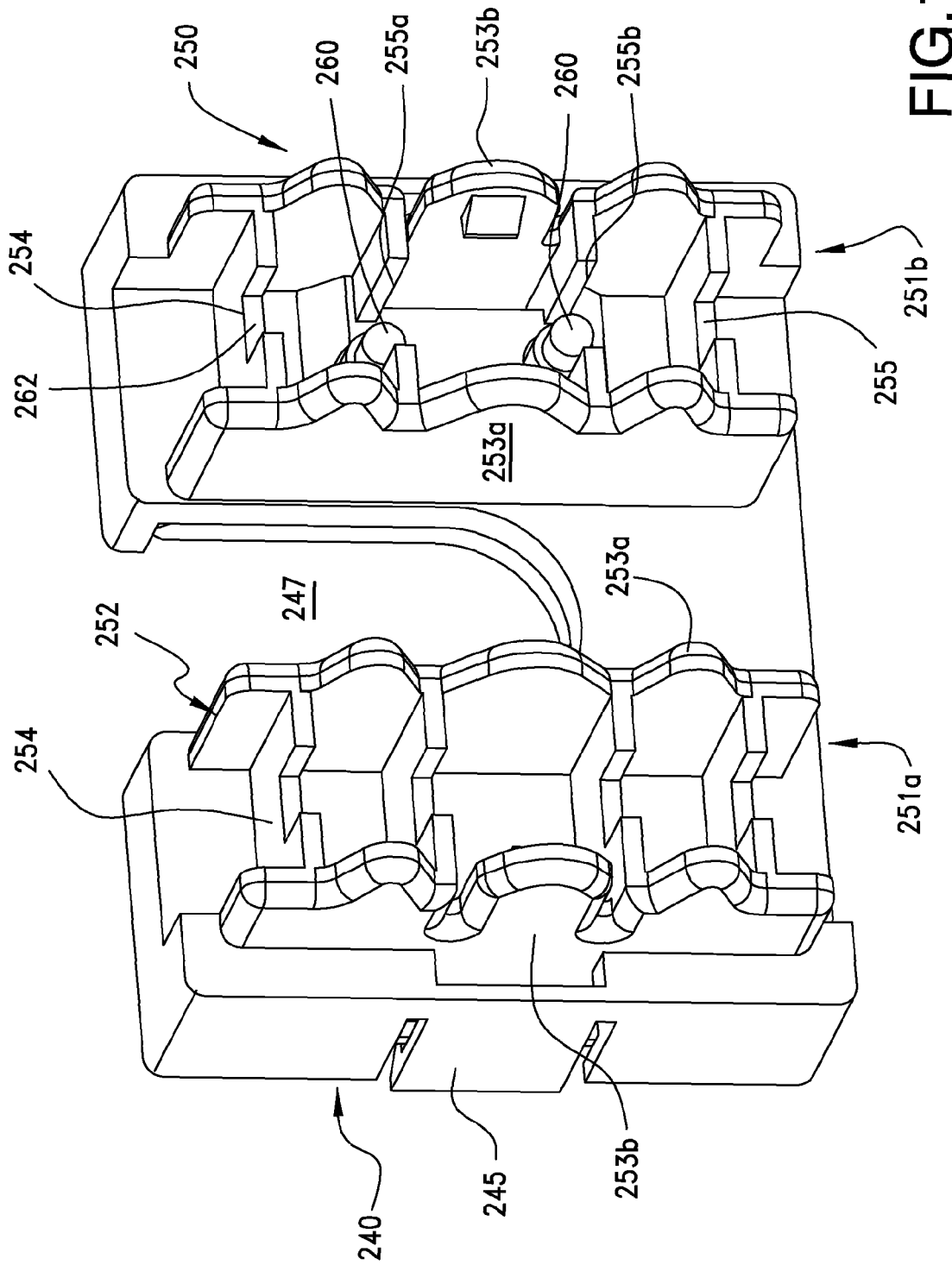
FIG. 14 is the same view as FIG, but taken from the rear, illustrating the terminals of the termination unit disposed within one of the two rows of engagement members.
Figure 15:
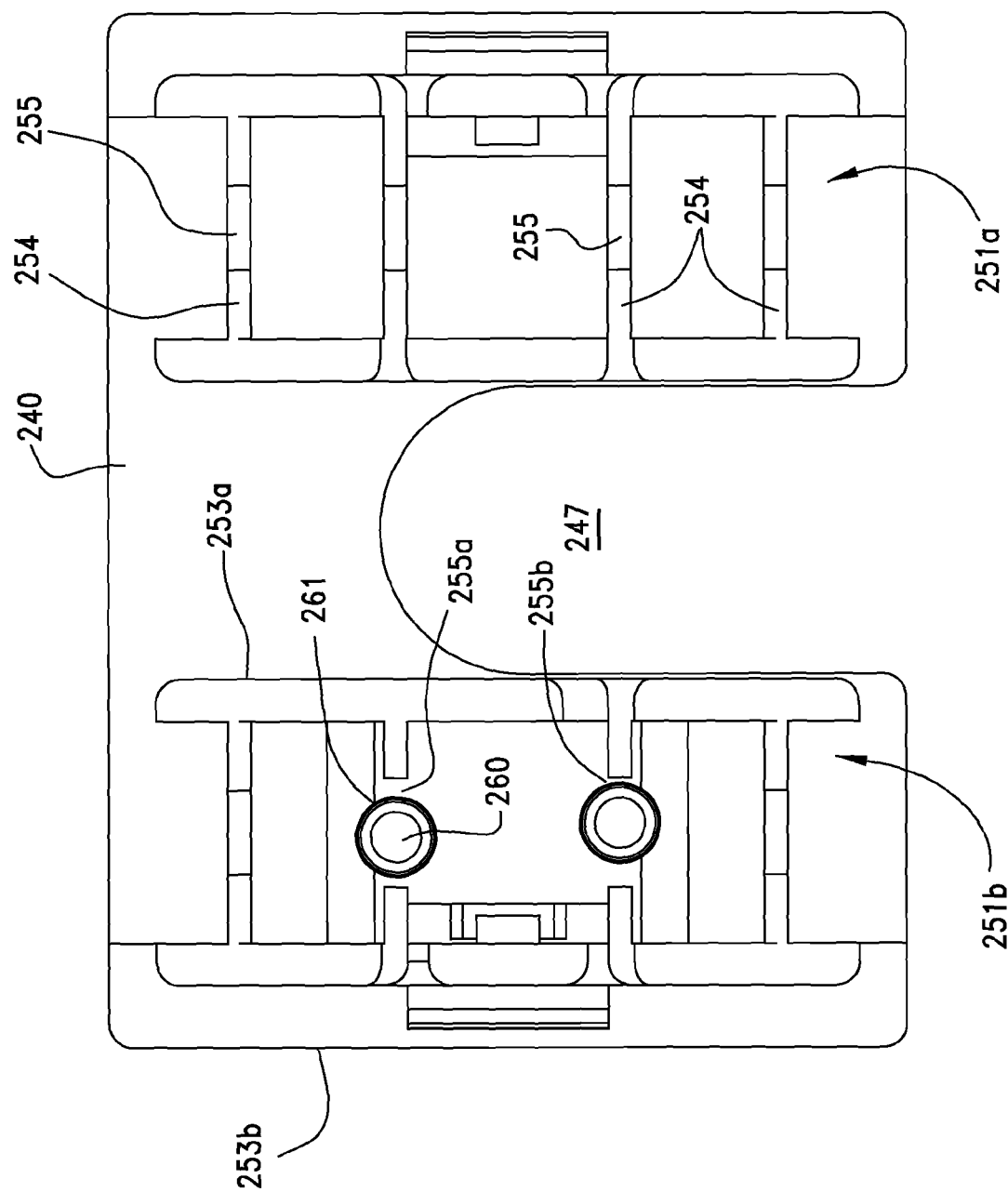
FIG. 15 is a plan view of the rear of the termination unit of FIG. 14.
Figure 16:
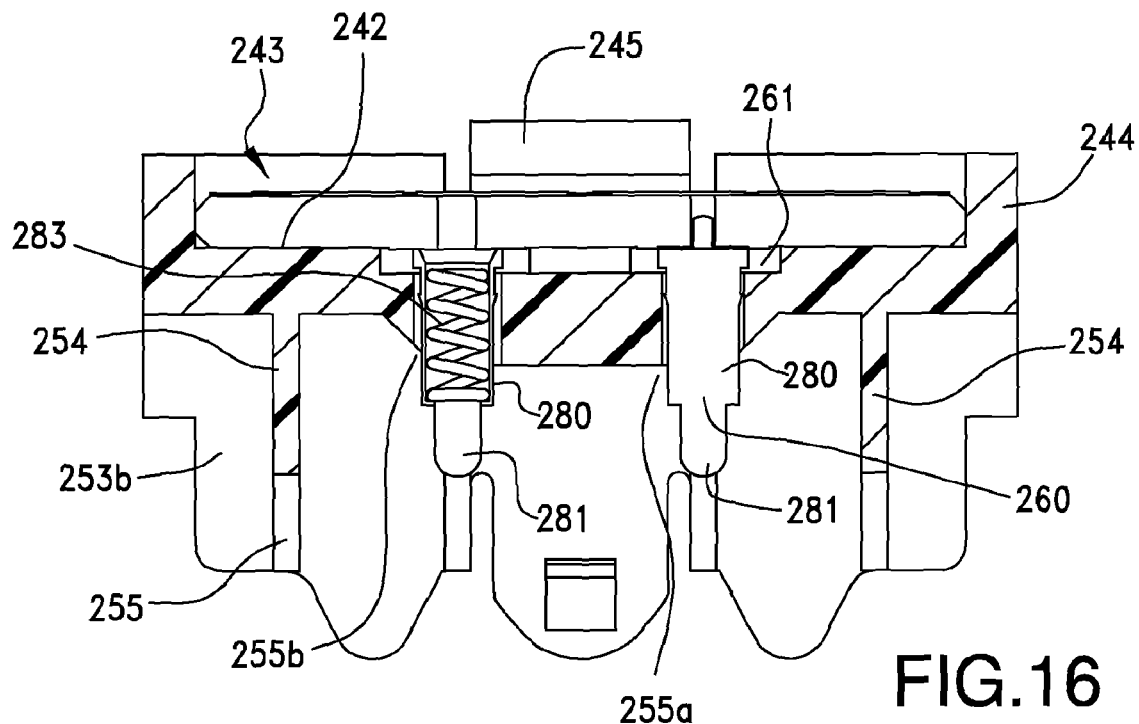
FIG. 16 is sectional view of the termination unit of FIG. 15, taken along lines 16-16 thereof.

As shown best in FIG. 14, the base portion 242 further includes a means for engaging the work area outlet termination face 212. This engagement means 250 is shown as two arrays, or rows 251a, 251b of projecting members 252, disposed on opposite sides of the central slot. Each such array, or row includes a pair of spaced-apart sidewalls 253a, 253b that have a series of interconnecting walls 254 which extend transversely to the sidewalls 253a, 253b in a spacing that matches that of the slots 220 located between the posts 216 of the termination face 212.

Each interconnecting wall 254 includes a central notch 255 disposed therein. These notches 255, as well as the interconnection walls 254, are aligned with the IDCs of the work area outlet termination face 212 so that the intervening walls 254 do not have significant contact with the IDCs that would tend to spread them apart and compromise the integrity of their connection with the cable wires. Two of the notches 255a, 255b are deeper than the other notches 255 and a pair of conductive terminals 260 are supported by the base portion 242 in this location so that they project outwardly from the base portion 242. These terminals 260 are shown in the Figures as pogo-pin style terminals and are received within corresponding bores 261 they have a length (or height) large enough so that they extend past, i.e. (above) the bottom wall 262 of the notches 255.

In this manner, contact in assured between the two terminals 260 (at their tips) and the IDT. Pogo-pin style terminals are desirable in that they have a cylindrical body portion 280 with a spring loaded tip 281 held within a bore of the body portion. The internal spring 283 (shown in FIGS. 12 to 16), urges the tips 281 outwardly but will yield and retract under external pressure. The spring keeps the tips in contact with the IDT tines portions 223 in the terminal slots 222, but deflects so that the tips 281 do not excessively spread the tine portions 223 apart.

Figure 17A:
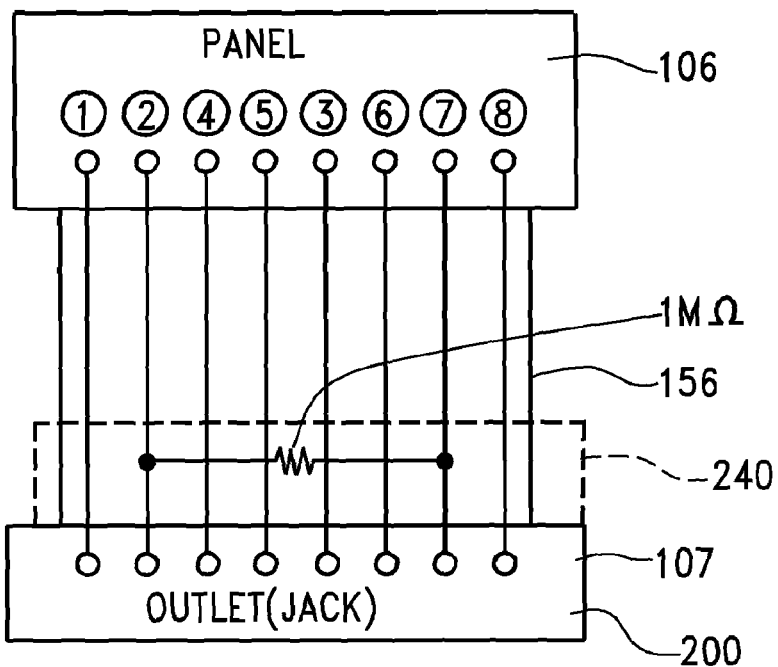
FIG. 17A is a schematic view of the network of FIG. 2 illustrating the four differential signal wire pairs of the network cable, and the connection between the resistance circuit of the termination cap and the wires at the work area outlet.

In this embodiment, the parallel sensing circuit is within the termination cap, rather than the work area outlet jack. The terminals 260 are connected to the substrate 246 and specifically to a circuit 270 or circuits containing at least one resistive element, such as a resistor 271. In operation, the resistive element 271 is part of a resistance circuit 270 that extends between the wires of two distinct differential signal pairs. An Ethernet standard cable has four differential signal pairs of wires, or eight wires total. In the present invention, the terminals 260 are arranged to form a circuit that extends between two of the signal wire pairs, connecting to one wire of a first differential pair to one wire of a second differential pair, rather than between wires that make up a pair. One usable resistance value is 1M (million) ohm that may connect to wires Nos. 2 and 7 of the four differential signal wire pairs. This is illustrated schematically in FIG. 17A, where a network cable 156 containing four pairs of wires dedicated to differential signal transmission are contained. The wires are shown grouped together as adjacent pairs 1-2, 4-5, 3-6 and 7-8. The termination unit resistance circuit is connected across two distinct differential signal wire pairs, shown as the two end pairs in FIG. 17A and specifically between wires 2 and 7 thereof. These two wires were chosen because they are aligned adjacent to each other on the terminating face of the work area outlet.

Figure 17B:
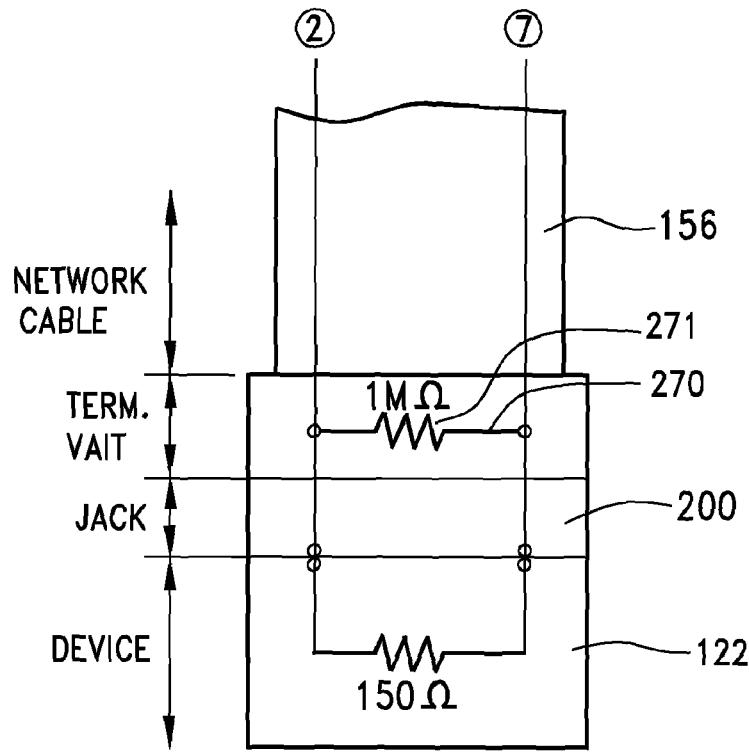
FIG. 17B is a schematic view of the connection between the network cable, the termination cap, the work area outlet and a network drive.

This connection creates the basis for a sensing circuit, described in this particular instance as the parallel resistance network structure shown in FIG. 17B along the network cable that extends between a patch panel 106 and a work area outlet 200. With the termination unit 240 in place upon a work area outlet, a sensing value equal to the constant resistance of 1M ohm is present via the sensing (resistance) circuit 270 of the termination unit 240. This value indicates to a scanner of the system that a termination unit 240 is connected to the work area outlet 200, and that there is neither a short circuit in the cable 156 terminated to the work area outlet 200 nor is there an end-user device, such as a PC 122, connected to the work area outlet 200. When an end-user is connected to the work area outlet 200, the network device 122 now forms a second sensing circuit that is parallel to the sensing circuit (namely, the resistance circuit 270) of the termination unit 240, and that is connected in parallel across the differential pairs. Electrical signals will take the path of the lowest resistance and hence pass through the end-user device 122 giving a resistance reading to the scanner of the work area outlet of about 150 ohms. This change in resistance immediately indicates to the scanner that an end-user device has been plugged into a work area outlet 200 of the network 100. Conversely, when the end-user device 122 is removed from a work area outlet 200, the resistance read at the work area outlet 200 by the scanner immediately rises to a fixed value (1 M ohms), which is different (greater) than 150 ohms and (less) than the resistance of an open circuit, namely, infinity. In this manner, the three conditions of a work area outlet 200 may be read: about 150 ohms: end-user device connected, about 1M ohms: termination unit 240 in place but no end-user device present; and infinity ohms: no termination unit or end-user device present. Other resistance values are contemplated to be sensed for other conditions, such as a shorting of a break in the network cable 156 to that particular work area outlet 108.

The termination unit 240 provides a sensing circuit that can be integrated into the work area outlet 200 such that the simple act of connecting or disconnecting an end-user device to the network work area outlet 200 forces a change in the impedance of the system that can be immediately measured. The termination units 240 may be easily installed at each existing work area outlet 200 of a network or new work area outlets when they are installed in a network. Their structure permits immediate connection to the network and the parallel resistance network that the unit 240 provides is a means by which the system connectivity may be monitored without relying upon numerous resistors or identifying codes. Accordingly, the network connectivity may be monitored remotely by reading the resistance at any given work area outlet to determine if an end-user device is or is not connected to the network at that particular work area outlet.

Capacitors may be used in place of the resistors described above and it will be appreciated that the manner in which they are used will effect a change in the status of the work area outlet that can be quickly detected by the scanner by way of a change in the impedance of the system connecting to that work area outlet. Likewise, inductors or any combination of elements that provide a change in the impedance of the system will also suffice. Termination caps may also be used at other connection points of the network in order to monitor the integrity and connectivity of the entire network. For example, a termination cap with a sensing element may be used at the connection of a network cable to a patch panel 106, as well as at the scanner 102, or even a switch 109, in addition to the work area outlet 107. The addition of these sensing elements to the sensing circuit will change the measureable system impedance which the scanner 102 can measure to determine connectivity and integrity of a particular cable or a particular cable connection. For example, the connection of two termination caps with sensing elements to the work area outlet 107 and the patch panel 106 will change the impedance of the system to a value different than the value obtained with only one termination cap with one sensing element attached to the work area outlet, as would the addition of a termination cap to a switch 109. In such case the impedance of the network may be determined using the parallel and series circuit sensing values and measuring the same. As such, the termination caps provide a system designer with increased status information of the network, using the network components as connection, or end points, such as a break in the network cable between a switch 109 and a patch panel 106 or a patch panel 106 and the work area outlet 107.

Figure 18:
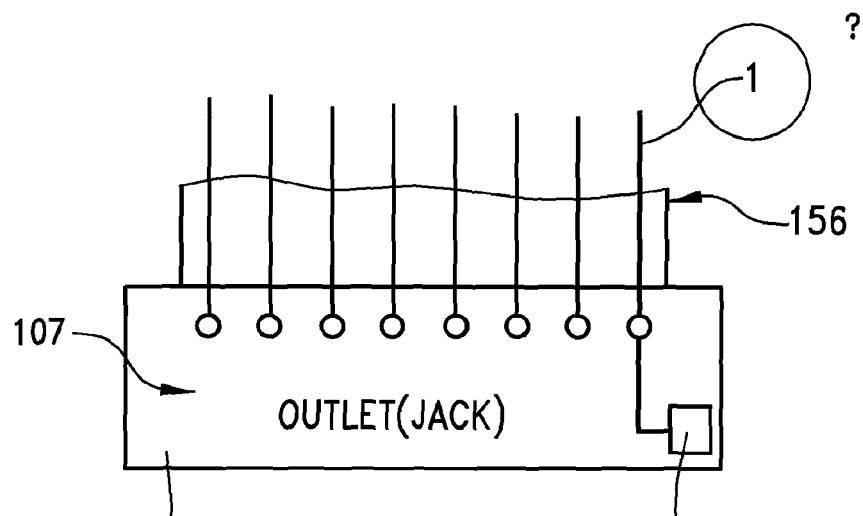
FIG. 18 is a diagram of an alternate embodiment of a sensing arrangement for use on a network.

Still further as illustrated in FIG. 18, an electronic element, such as a resistor, capacitor, inductor or the like may be connected to one of the work area outlet terminals, and the element may have an electronic serial number associated therewith which can be read by the scanner as well as its particular value for identifying the work area outlet and the network device.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:
1. A termination unit for use in a wired computing network having a plurality of end-user devices, the termination unit comprising:
   a jack having an opening sized to receive a plug connector, and a termination face for terminating wires of a network cable thereto, said jack further including a plurality of conductive terminals disposed within said opening and extending to the jack termination face for connecting to the wires of the network cable, said jack further including a shutter movably mounted within the jack opening; and at least one electronic element having a first impedance value, the electronic element being operatively connected to the shutter, the shutter being moveable between first and second operative positions, wherein in the first operative position, the electronic element is not connected to said terminals and in the second operative position, said electronic element is connected to said terminals to provide a second impedance value across said two terminal that is different than the first impedance value.

2. The termination unit of claim 1, wherein said electronic element is chosen from the group consisting of resistors, capacitors, inductors or combinations thereof.

3. The termination unit of claim 1, wherein said shutter is closed when in said first operative position and said shutter is open when in said second operative position.

4. An endcap for a work area outlet, the work area outlet having a termination face with a plurality of data transmission wires terminated thereto and the endcap providing a sensing circuit with a preselected impedance for connecting across two of the terminated wires, said endcap comprising:

an insulative body portion, having opposing first and second faces, the first face including a plurality of engagement members for engaging the termination face of said work area outlet, the engagement members being arranged thereupon in two distinct rows separated by an intervening space, the second face supporting a circuit substrate thereupon, the body portion further including a slot disposed in the body portion intervening space and extending through said body portion between said first and second faces; and a pair of conductive terminals supported by said body portion, the terminals including opposing contact and termination ends, the terminals extending longitudinally through said body portion such that termination ends contact the circuit substrate and said contact ends extend within one of said rows of engagement members, said circuit substrate further including the sensing circuit with an electronic element connected to said terminals, whereby, when said endcap is affixed to said work area outlet termination face, said engagement members engage said termination face and said terminals make contact with two of said data transmission wires to define a sensing circuit therebetween with a given impedance value.

5. The endcap of claim 4, wherein said data transmission outlet is an Ethernet jack.

6. The endcap of claim 4, wherein said termination face includes a plurality of insulation displacement terminals that are housed in slots of said termination face, and said engagement members extend from said base portion to engage the slots.

7. The endcap of claim 4, wherein said terminals include pogo-pin terminals.

8. The endcap of claim 4, wherein said endcap engagement members are arrayed in two distinct arrays, each array including a pair of side walls interconnected together by multiple interconnecting walls, said terminals being disposed within one of said arrays, each one of said terminals being respectively aligned with two of the interconnecting walls.

9. The endcap of claim 8, wherein each interconnecting wall includes a notch centrally disposed therein, the notch having a first depth sufficient not to contact said IDC terminals of said jack.

10. The endcap of claim 9, wherein two of said notches have a second depth, the second depth being greater than said first depth, and one of said terminals is aligned with each of said two notches.

11. The endcap of claim 10, where said terminals are disposed on said body portion on one side of said slot.

12. The endcap of claim 8, wherein said terminals have a height greater than said notch first depth.

13. The endcap of claim 4, where said electronic element is chosen from the group consisting of resistors, capacitors, inductors or combinations of the same.

14. A termination element for engaging a work area outlet of a data transmission network, the termination element including means for providing a sensing circuit at the work area outlet, said work area outlet including a mating face for connecting to an end-user device and a terminating face to which a network cable is terminated, the network cable including a plurality of differential signal wire pairs, the work area outlet terminating face including a plurality of insulation displacement technology ("IDT") terminals, each of the IDT terminals adapted to engage a single wire of said network cable, the termination element comprising:

a housing, the housing supporting a circuit substrate thereon, the circuit substrate including at least one sensing circuit that includes at least one electronic element having a preselected impedance, said housing and the circuit substrate including a cable receiving slot for permitting the connecting of said termination element to said work area outlet terminating face over said network cable;

a plurality of engagement members disposed in two arrays on a mating face of said housing, the engagement member arrays being spaced apart from each other by an intervening space and the cable-receiving slot being disposed in the intervening space, each engagement member array including a pair of sidewalls that are interconnected by transverse walls, the transverse walls being arranged in a pattern in alignment with respective engagement slots of said work area outlet terminating face and with said IDT terminals disposed thereon; and a pair of conductive terminals supported in said housing and aligned with two of said IDT terminals supported by said work area outlet terminating face, the terminals including opposing tail and contact ends, the tail ends thereof being connected to the sensing circuit of said circuit substrate, said terminals extending away from said circuit substrate within one of said engagement member arrays and between the sidewalls of the one engagement member array, said transverse walls each including a notch formed therein, said terminals being disposed within two respective adjacent notches of said transverse walls, said sensing circuit contacting terminals of said work area outlet when said termination element is engaged therewith to thereby change the resistance of the work area outlet when a network device is connected thereto.

15. The termination element of claim 14, wherein said terminals each include a base portion and a tip portion held within the base portion and a biasing spring interposed between the base and tip portions, the biasing spring permitting said terminal tip portions to deflect under a termination pressure when said termination element is mated to said work area outlet terminating face.

16. The termination element of claim 14, wherein said terminals include pogo-pin terminals.

17. The termination element of claim 14, where said electronic element is a resistor with value of at least about 1,000,000 ohms.

18. The termination element of claim 14, wherein said terminals are disposed on said housing to contact said IDT terminals connected to different pairs of differential signal wires of said network cable to define a resistance circuit connected to said work area outlet.

19. The termination element of claim 14, wherein said electronic element is chosen from the group consisting of resistors, capacitors, inductors or combinations thereof.

20. A termination unit for use in a wired computing network interconnecting together a plurality of end-user, the termination unit comprising:
   a jack having an opening sized to receive a plug connector, and a termination face for terminating wires of a network cable thereto, said jack further including a plurality of conductive terminals disposed within said opening and extending to the jack termination face for connecting to the wires of the network cable; and
   at least one electronic element having an measurable sensing value and a discrete electronic identifier associated therewith that is capable of being read by a scanner connected to the network, the discrete electronic identifier identifying said jack to the scanner, upon request from the scanner.

21. A termination element for engaging a connection point on a data transmission network, the termination element including means for providing a sensing circuit at the connection point, the connection points being interconnected on the network by network cables including a plurality of differential signal wire pairs, said connection points further including a plurality of conductive terminals adapted to connect with single wires of said network cable, the termination element comprising:
   a housing, the termination element housing supporting a circuit substrate thereon, the circuit substrate including at least one sensing circuit that includes at least one electronic element having a preselected impedance, and said termination housing including a mating face for mating with said connection points;
   at least one engagement member disposed on a mating face of said housing; and
   a pair of conductive members supported in said termination element housing and aligned with two of said connection point terminals, the conductive members being connected to the sensing circuit of said circuit substrate, said sensing circuit contacting said conductive members of said work area outlet when said termination element is engaged therewith to thereby change the impedance of said connection point when a network cable is connected thereto.

22. A method, in a data network having a plurality of work area outlets, of determining if an end-user device is connected to any of the work area outlets, comprising the steps of:
   providing a plurality of work area outlets;
   connecting terminals of the work area outlets to network cables, each of the network cables containing multiple data transmission wires, each such wire being terminated to a work area outlet terminal, the wires being arranged in pairs for transmitting differential signals within the network;
   providing termination units for connection to the work area outlets, each of the termination units including a housing supporting a sensing circuit, the termination unit housing including a slot for permitting the said network cable to pass through the termination unit, a plurality of engagement members disposed in two arrays on said housing and which are spaced apart from each other by an intervening space and the cable-receiving slot being disposed in the intervening space, each engagement member array including a pair of sidewalls that are interconnected by transverse walls which are aligned with respective terminals of said housing, disposed thereon, and a pair of conductive terminals supported in said housing and aligned with two of said IDC terminals, the terminals including tail ends connected to the sensing circuit and contact ends for engaging said IDC terminals;
   connecting said termination units to said outlets so that said termination unit terminal contact ends contact said work are outlet terminals to connect the sensing circuits, in parallel, to two of said network cable wires so as to form a parallel sensing circuit between two wires of said network cable which are chosen from two distinct differential signal pairs of wires of said network cable, the sensing circuit having a first impedance value which is different than a second impedance value of a network device; and
   reading the impedance at said work area outlet, the first impedance value indicating that no end-user device is connected and the second impedance value indicating that an end-user device is connected to said work area outlet.

* * * * *